United States Patent
Hwang et al.

(10) Patent No.: US 7,372,754 B2
(45) Date of Patent: May 13, 2008

(54) METHOD AND APPARATUS FOR CONTROLLING SLOPE OF WORD LINE VOLTAGE IN NONVOLATILE MEMORY DEVICE

(75) Inventors: Sang-Won Hwang, Gyeonggi-do (KR); Jin-Wook Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/354,917

(22) Filed: Feb. 16, 2006

(65) Prior Publication Data
US 2007/0025155 A1    Feb. 1, 2007

(30) Foreign Application Priority Data
Jul. 26, 2005    (KR) ............... 10-2005-0068028

(51) Int. Cl.
*G11C 7/00*    (2006.01)
(52) U.S. Cl. ............... 365/218; 365/156; 365/157; 365/226; 365/227
(58) Field of Classification Search ............... 365/218, 365/156, 157, 226, 227
See application file for complete search history.

(56) References Cited

U.S. PATENT DOCUMENTS

| | | | |
|---|---|---|---|
| 5,761,151 A * | 6/1998 | Hatakeyama | ............ 365/233.5 |
| 6,108,235 A | 8/2000 | Honma et al. | |
| 6,804,150 B2 * | 10/2004 | Park et al. | ............. 365/185.18 |

FOREIGN PATENT DOCUMENTS

| | | |
|---|---|---|
| JP | 2001-229681 | 8/2001 |
| JP | 2004-158074 | 6/2004 |
| KR | 1020030021647 A | 3/2003 |

* cited by examiner

*Primary Examiner*—Pho M. Luu
(74) *Attorney, Agent, or Firm*—Volentine & Whitt, PLLC

(57) ABSTRACT

A nonvolatile memory device includes a nonvolatile memory cell array including a plurality of nonvolatile memory cells connected to a plurality of word lines, a word line voltage generator configured to generate first and second sequences of voltage pulses. The device selectively supplies one of the first and second sequences of voltage pulses to a selected one of the word lines to program the nonvolatile memory cells connected to the selected word line. A slope of at least one voltage pulse of the first sequence of voltage pulses is greater than a slope of at least one voltage pulse of the second sequence of voltage pulses. In general, the first sequence is applied to word lines far away from the string select line (SSL), and the second sequence is applied to word lines that are close to the SSL.

39 Claims, 25 Drawing Sheets

METHOD AND APPARATUS FOR CONTROLLING SLOPE OF WORD LINE VOLTAGE IN NONVOLATILE MEMORY DEVICE

BACKGROUND AND SUMMARY

1. Field

This invention relates, in general, to nonvolatile semiconductor memory devices and, more particularly, to a method and apparatus for controlling the slope of a word line voltage in a nonvolatile semiconductor memory device, a nonvolatile semiconductor memory device including such an apparatus and executing such a method, and a memory system including such a nonvolatile semiconductor memory device.

2. Description

Semiconductor memories are classified into volatile semiconductor memories and non-volatile semiconductor memories. In the volatile semiconductor memories, data are stored and can be read out as long as the power is applied, and are lost when the power is turned off. On the other hand, non-volatile memories such as an MROM (MASK ROM), a PROM (Programmable ROM), an EPROM (Erasable and Programmable ROM), an EEPROM (Electrically Erasable and Programmable ROM), and flash memories are capable of storing data even with the power turned off.

Of these devices, flash memories are classified into NOR-type flash memories and NAND-type flash memories according to a connection structure of a cell and a bitline. The NOR-type flash memory can be easily adapted to high-speed operation, but has a disadvantage when it comes to providing a high degree of integration. In contrast, the NAND-type flash memory is advantageous when it comes to providing a high degree of integration.

FIGS. 1A and 1B illustrate, respectively an initial state and a programmed state of a flash memory cell transistor having a floating gate.

As shown in FIGS. 1A-B, a single transistor-type flash memory cell 100 generally comprises: a channel formed between a source 105 and a drain 110 on a semiconductor substrate 115; a control gate 120; and a floating gate 130 formed between a dielectric oxide 140 and a gate oxide 150, where dielectric oxide 140, floating gate 130, gate oxide 150, and control gate 120 are stacked on the channel. Floating gate 130 traps electrons, and the trapped electrons are used to establish the threshold voltage of flash memory cell 100. The electrons moving to floating gate 130 are generated by Fowler-Nordheim tunneling (FN), electron injection, etc. Electron injection may be performed by channel hot-electron injection (CHE), channel-initiated secondary electron injection (CISEI), etc. Also, Fowler-Nordheim tunneling (FN) is generally used in flash memory devices for erasing data all at once. Further, when the nonvolatile semiconductor memory device performs a read operation, the data value stored in flash memory cell 100 is determined through sensing the threshold voltage of flash memory cell 100, as discussed in further detail below.

As shown in FIG. 1A, initially flash memory cell 100 is in a "non-programmed" (or "erased") state and stores a logical "1" therein. In the non-programmed state, flash memory cell 100 has an initial threshold voltage, $V_{TH1}$, such that when a voltage less than $V_{TH1}$ is applied to control gate 120, flash memory cell 100 is turned off, but when a voltage greater than $V_{TH1}$ is applied to control gate 120, flash memory cell 100 is turned on.

Meanwhile, as shown in FIG. 1B, flash memory cell 100 stores a logical "0" when it is in a "programmed" state. In the programmed state, memory cell 100 has a threshold voltage, $V_{TH2}$ greater than $V_{TH1}$, such that when a voltage less than $V_{TH2}$ is applied to control gate 120, flash memory cell 100 is turned off, but when a voltage greater than $V_{TH2}$ is applied to control gate 120, flash memory cell 100 is turned on.

FIGS. 2A and 2B illustrate, respectively an erase operation and a programming operation for flash memory cell 100.

As seen in FIG. 2A, an erase operation is performed on flash memory cell 100 to store logical a "1"0 therein by applying an erase voltage "$V_{ERASE}$" to the bulk substrate 115 of flash memory cell 100 and grounding control gate 120 to thereby remove electrons from memory cell 100's floating gate 130. Removing electrons from floating gate 130 reduces the threshold voltage of flash memory cell 100 to $V_{TH1}$, as shown in FIG. 3. FIG. 3 shows that the threshold voltages $V_{TH1}$ of all of the memory cells in the device will not be the same, but instead the threshold voltages $V_{TH1}$ will have some distribution and variance about a mean value. In a typical example, threshold voltage $V_{TH1}$ may be distributed from −1V to −3V. After the erase operation is performed on flash memory cell 100, it is referred to as an "Erased Cell", and it stores a logical "1." In general, the erase voltage $V_{ERASE}$ is greater than an operating voltage $V_{CC}$ of the NAND flash memory device. For instance, the erase voltage could be 19V while operating voltage $V_{CC}$ is only 5V.

As seen in FIG. 2B, a programming operation is performed on flash memory cell 100 to store a logical "0" therein by applying a program voltage $V_{PGM}$ to control gate 120 of flash memory cell 110, and causing current to flow source 105 and drain 110 to thereby cause electrons in the current to be stored in floating gate 130. Storing electrons in floating gate 130 increases the threshold voltage of flash memory cell 100 to $V_{TH2}$, as shown in FIG. 3. FIG. 3 shows that the threshold voltages $V_{TH2}$ of all of the memory cells in the device will not be the same, but instead the threshold voltages $V_{TH2}$ will have some distribution and variance about a mean value. In a typical example, threshold voltage $V_{TH2}$ may be distributed from +1V to +3V. After the programming operation is performed on flash memory cell 100, it is referred to as a "Programmed Cell", and it stores a logical "0."

A NAND-type flash memory device typically comprises a memory cell array (or memory block) including a plurality of NAND flash memory cell strings ("strings") 300 connected to bit lines BL0 through BLn-1, respectively. FIG. 4 illustrates a basic NAND flash memory cell string 400. Each string 400 comprises a string selection transistor (SST), a ground selection transistor (GST), and a plurality of flash memory cells 100 serially connected between string selection transistor SST and ground selection transistor GST. Typically, either 16 or 32 flash memory cells 100 are serially connected in flash memory cell string 400. String select transistor SST has a drain connected to a corresponding bit line and a gate connected to a string select line (SSL). Memory cells 100 are connected to corresponding word lines WL0 through WLm-1, respectively. Word lines WL0 through WLm-1, string select line SSL, and ground select line GSL are driven by a row selector circuit (not shown in FIG. 4)

A NAND flash memory device can perform write and program operations on individual flash memory cell strings 400. However, the NAND flash memory device can only perform an erase operation in the unit of one memory block.

In order to program the memory cells of a selected row (or word line) of a NAND flash memory device, the memory cells in a memory block (or a memory cell array) are first erased in order to give each memory cell the threshold voltage $V_{TH1}$ that is below 0V (all memory cells store a logical "1"). Once the memory cells are erased, program data is loaded onto a page buffer circuit of the NAND flash memory device, and then a high voltage pump circuit generates relatively high voltages for a programming operation. Afterward, the loaded data is programmed into the memory cells of a selected word line by the iteration of program loops. Each of the program loops consists of a bit line setup interval, a program interval, a discharge/recovery interval, and a verification interval.

During the bit line setup interval, bit lines BL0 through BL(n-1) are charged to a power supply voltage $V_{CC}$ or a ground voltage in accordance with the loaded program data. That is, as shown in FIG. 5, a bit line BL for a memory cell to be programmed is charged to the ground voltage, and a bit line BL for a memory cell to be program inhibited (i.e., not programmed) is charged to the power supply voltage $V_{CC}$. Within the program interval, the program voltage $V_{PGM}$ is supplied to a selected word line and a lower pass voltage $V_{PASS}$ is supplied to the unselected word lines. For memory cells connected to the selected word line and to a bit line charged to the ground voltage, the channel voltage is zero volts, and a bias condition (e.g., 18V) great enough to induce F-N tunneling is satisfied, so electrons are injected from the bulk to the floating gates of the memory cells. On the other hand, as is well known in the art, for memory cells connected to bit lines that are charged to the power supply voltage $V_{CC}$, the string select transistor (SST) is electrically turned off and the channel voltage of the memory cell connected to the selected word line rises by self-boosting to a voltage level (e.g., 8 volts) sufficient to prevent F-N tunneling and thereby inhibit programming of the memory cell (see FIG. 6). The voltages of the bit lines and the word lines are discharged during the discharge interval, which functions as a recovery interval, and whether the memory cells have been programmed to the desired target threshold voltage is determined during the verification interval.

A step pulse program technique has been developed for programming a flash memory device. FIG. 7 shows a pulse program voltage applied to a selected word line connected to a control gate of a flash memory cell to be programmed. As can be seen in FIG. 7, the program voltage (e.g., 18 V) is applied to the selected word line in a series of program pulses. In between each program pulse is a "verify period" where the data stored in the memory cells being programmed is read. When it is determined that a memory cell connected to the selected word line is programmed as desired, then as shown in FIG. 5, further programming of that memory cell is inhibited for this program operation by charging the associated bit line for the memory cell to $V_{CC}$.

Typically, in the memory cells of a nonvolatile semiconductor memory device, a programming operation and an erase operation can be performed repeatedly. Flash memory cells are programmed in units of one page. That is, for example, flash memory cells comprising 512 bytes of memory are simultaneously programmed. Meanwhile, flash memory cells are erased in units of one block. That is, for example, flash memory cells comprising 32 pages (e.g., 16 kbytes of memory) are simultaneously programmed.

To read the data stored in a memory cell, a voltage $V_{READ}$ is applied to the control gate of the memory cell. $V_{READ}$ is selected to fall between $V_{TH1}$ and $V_{TH2}$, i.e., $V_{TH1} < V_{READ} < V_{TH2}$. For example, where $V_{TH1}$ is typically −2V and $V_{TH1}$ is typically +2V, then $V_{READ}$ may be 0V (ground). In that case, if the memory cell is turned on when $V_{READ}$ is applied to its control gate, then the memory cell is determined to be an erased cell, storing a logical "1" therein. On the other hand, if the memory cell remains off when $V_{READ}$ is applied to its control gate, then the memory cell is determined to be a programmed cell, storing a logical "0" therein.

As shown in FIG. 3 above, in general the various memory cells in a memory device have different values for each of the first and second threshold voltages $V_{TH1}$ and $V_{TH2}$, the first and second threshold voltages each being distributed around a mean value with some variance. However, if the variance or distribution of threshold voltages becomes too wide, the difference between the first and second threshold voltages becomes less and less, reducing an operating or noise margin for $V_{READ}$ to read data from a memory cell.

Accordingly, an incremental step pulse program (ISPP) technique has been developed for programming flash memory cells, to reduce the variation of threshold voltages among the flash memory cells of a flash memory device. As shown in FIG. 8, a series of pulses having gradually increasing voltage levels are applied to the selected word line. Otherwise, the operation is the same as that discussed above with respect to FIG. 7. FIG. 9 shows how the threshold voltage distribution changes after the first pulse, the second pulse having a greater voltage than the first pulse, the third pulse having a greater voltage than the second pulse, etc. By using the ISSP technique, the variation in the threshold voltages among the flash memory cells of a flash memory device is reduced.

However, there is a problem with the flash memory cell programming techniques described above, including the ISSP technique. This problem will be explained with respect to FIGS. 10-11.

FIG. 10 shows a flash memory cell string 1000, illustrating parasitic coupling capacitances that exist between the word lines connected to the various memory cells of the string 1000. Of particular interest is the capacitance 1010 between word line 31 and the adjacent string select line (SSL). As illustrated in FIG. 11, this parasitic coupling capacitance can create a problem when word line 31 is selected during a flash memory cell program operation.

In particular, during a flash memory cell program operation a supply voltage level $V_{CC}$ is applied to SSL, raising the channel voltage for all memory cells of the string 1100 to ($V_{CC}-V_{TH}$). Then, when word line 31 is selected, the program voltage $V_{PGM}$ of a relatively high voltage level (e.g., 15-18 volts) is applied to word line 31 to program the memory cell 1050 connected thereto, while a lower pass voltage $V_{PASS}$ is applied to each of the remaining, unselected word lines. $V_{PASS}$ has a voltage level such that when the bit line is grounded, the voltage is sufficient to turn on the memory cells connected with these unselected word lines, but insufficient to program these memory cells.

As shown in FIG. 11, due to the capacitance 1010 between word line 31 and the adjacent string select line (SSL), the rising edge of the program voltage $V_{PGM}$ creates a voltage spike on the SSL. This spike may increase the voltage at the control gate of the string select transistor (SST) to be $V_{SSL} > (V_{CC}+V_{TH})$. Meanwhile, as explained above, if the memory cell 1050 connected to the selected word line 31 is intended not be programmed (program inhibited), then the associated bit line is connected to the supply voltage $V_{CC}$. In that case, when the voltage on the control gate of the SST becomes $V_{SSL} > (V_{CC}+V_{TH})$, then the SST may turn on, causing a decrease in the channel voltage for memory cell 1050, as shown in FIG. 11. The decrease in the channel voltage of memory cell 1050, combined with the program voltage $V_{PGM}$ applied to the control gate of memory cell 1050 may present a bias condition which permits F-N tunneling to occur for memory cell 1050, thereby programming memory cell 1050, even though such programming is supposed to be inhibited. In other words, the program inhibit operation may fail. Moreover, due to the coupling capacitances, a similar problem may also occur when another word line (e.g., word line 30) located near the SSL is selected.

One proposed solution to address this problem is shown in FIG. 12. In particular, by decreasing the slope (increasing the rise time) of the program voltage $V_{PGM}$ applied to the selected word line, the voltage spike induced by coupling capacitance onto the SSL may be reduced or eliminated so as to prevent the SST from turning on when it is connected to a bit line charged to $V_{CC}$ (program inhibit) during a programming operation. In turn, this prevents the decrease in the channel voltage for the memory cell connected to the selected word line whose programming is to be inhibited. Accordingly, F-N tunneling is prevented for the memory cell, and the program inhibit function operates properly.

However, when the slope of the program voltage $V_{PGM}$ is decreased (rise time is decreased), then the time required for a programming operation is correspondingly increased.

Accordingly, it would be advantageous to provide a nonvolatile memory device that can address one or more of the proceeding concerns. It would also be advantageous to provide a method of programming such a nonvolatile memory device. It would further be advantageous to provide a memory system that incorporates such a nonvolatile memory device. Other and further objects and advantages will appear hereinafter.

The present invention comprises method and apparatus for controlling the slope of a word line voltage in a nonvolatile semiconductor memory device, a nonvolatile semiconductor memory device including such an apparatus and executing such a method, and a memory system including such a nonvolatile semiconductor memory device.

In one aspect of the invention, a nonvolatile memory device comprises: a nonvolatile memory cell array including a plurality of nonvolatile memory cells connected to a plurality of word lines: and a word line voltage generator configured to generate first and second sequences of voltage pulses, and to selectively supply one of the first and second sequences of voltage pulses to a selected one of the word lines to program the nonvolatile memory cells connected to the selected word line, wherein a slope of at least one voltage pulse of the first sequence of voltage pulses is greater than a slope of at least one voltage pulse of the second sequence of voltage pulses.

In another aspect of the invention, a nonvolatile memory device comprises a nonvolatile memory cell array including plurality of nonvolatile memory cells connected to a plurality of word lines and a plurality of bit lines, the memory cells of each bit line including a plurality of strings, the array further including a plurality of select lines for selecting the strings, and the word lines including at least a first set of one or more word lines and a second set of one or more word lines; and a word line voltage generator configured to generate first and second sequences of voltage pulses to program the nonvolatile memory cells connected to a selected one of the word lines, to supply the first sequence of voltage pulses to the selected word line when the selected word line belongs to the first set of one or more word lines, and to supply the second sequence of voltage pulses to the selected word line when the selected word line belongs to the second set of one or more word lines, wherein the second set of one or more word lines is closer to one of the select lines than the first set of one or more word lines is, and wherein a slope of at least one voltage pulse of the first sequence of voltage pulses is greater than a slope of at least one voltage pulse of the second sequence of voltage pulses.

In a further aspect of the invention, a method of programming a nonvolatile memory device including a nonvolatile memory cell array having a plurality of nonvolatile memory cells connected to a plurality of word lines comprises: applying a first sequence of voltage pulses to a first one of the word lines when programming the nonvolatile memory cells connected to the first word line; and applying a second sequence of voltage pulses to a second one of the word lines when programming the nonvolatile memory cells connected to the second word line, wherein a slope of at least one voltage pulse of the first sequence of voltage pulses is greater than a slope of at least one voltage pulse of the second sequence of voltage pulses.

In yet another aspect of the invention, a system comprises: a nonvolatile memory device including a nonvolatile memory cell array having a plurality of nonvolatile memory cells connected to a plurality of word lines, and a word line voltage generator configured to generate first and second sequences of voltage pulses, and to selectively supply one of the first and second sequences of voltage pulses to a selected one of the word lines to program the nonvolatile memory cells connected to the selected word line, wherein a slope of at least one voltage pulse of the first sequence of voltage pulses is greater than a slope of at least one voltage pulse of the second sequence of voltage pulses; and a memory controller for supplying an address corresponding to the selected word line for writing data to the nonvolatile memory cells connected to the selected word line.

DETAILED DESCRIPTION

Figure 1B:
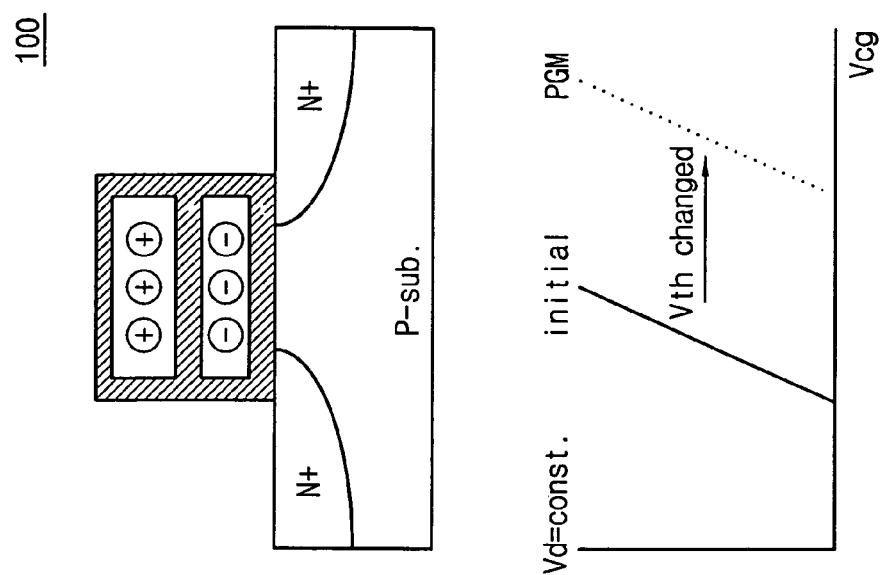
FIGS. 1A-B illustrate, respectively, an erased flash memory cell and a programmed flash memory cell.
Figure 1A:
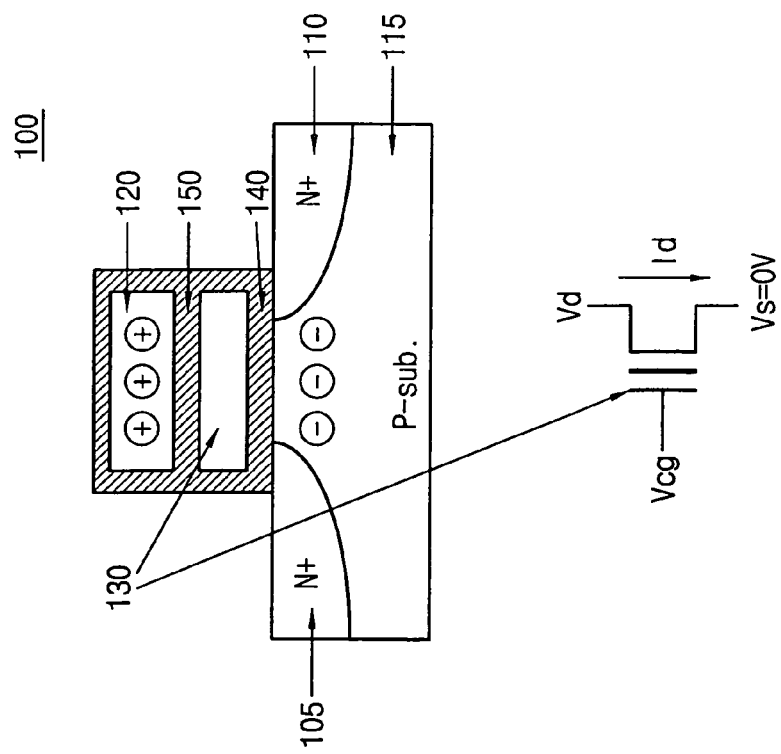
Figure 2B:
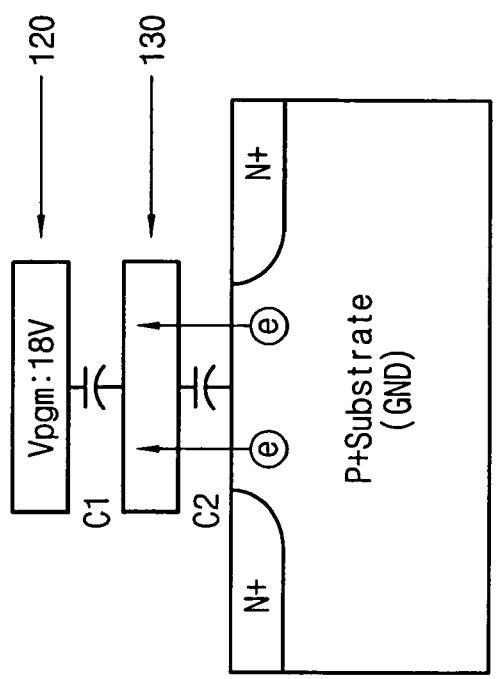
FIGS. 2A and 2B illustrate, respectively, an erase operation and a programming operation for a flash memory cell.
Figure 2A:
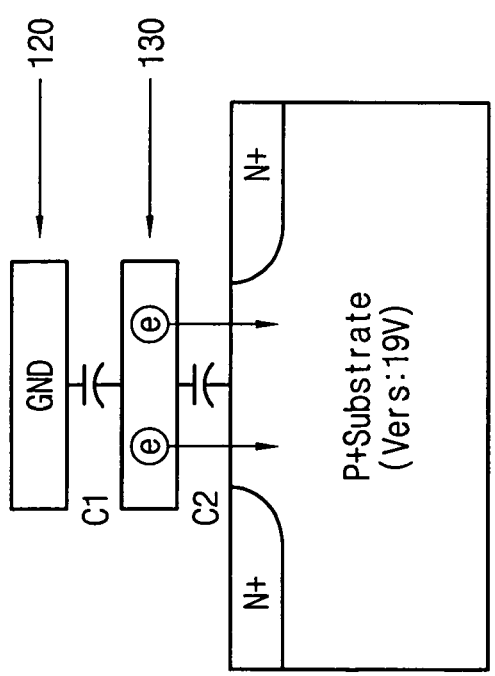
Figure 3:
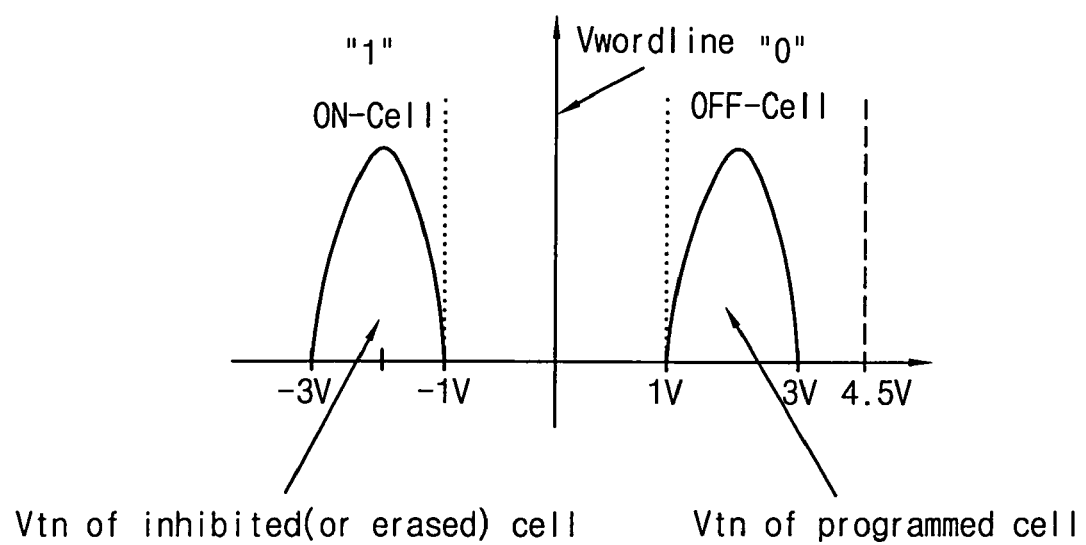
FIG. 3 illustrates the distribution of threshold voltage levels for different memory cells in a flash memory device.
Figure 4:
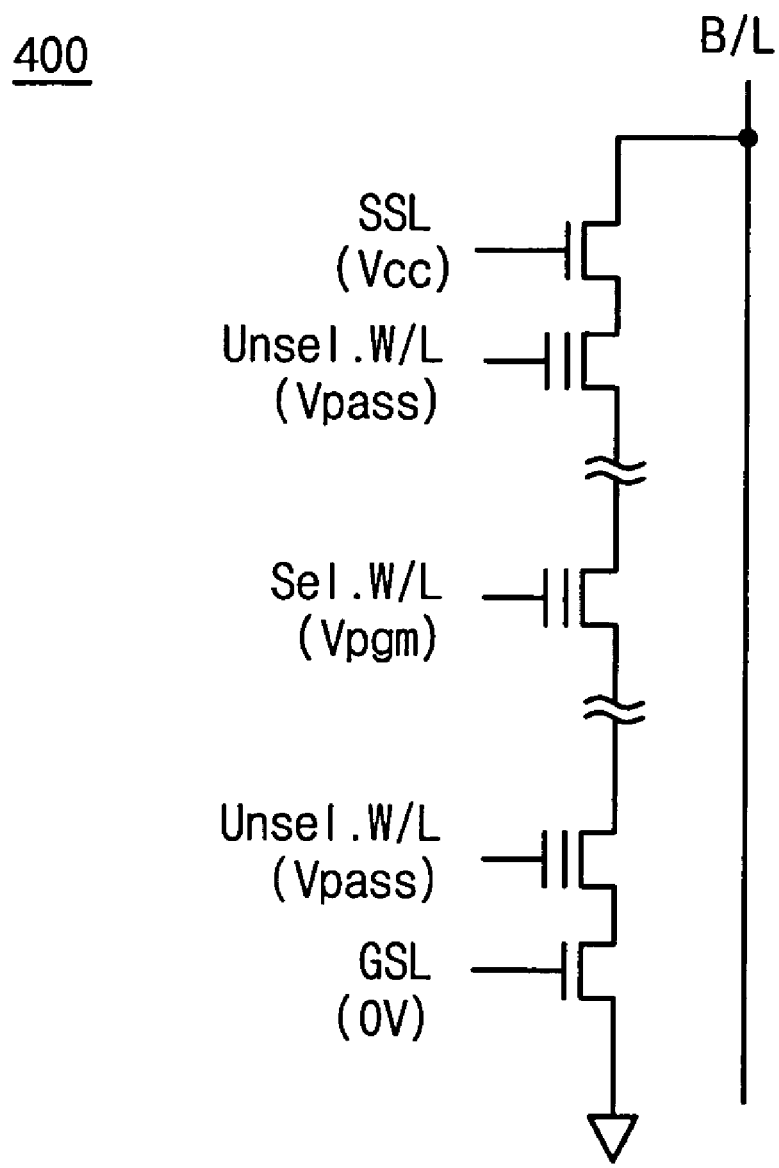
FIG. 4 illustrates a basic NAND flash memory cell string.
Figure 5:
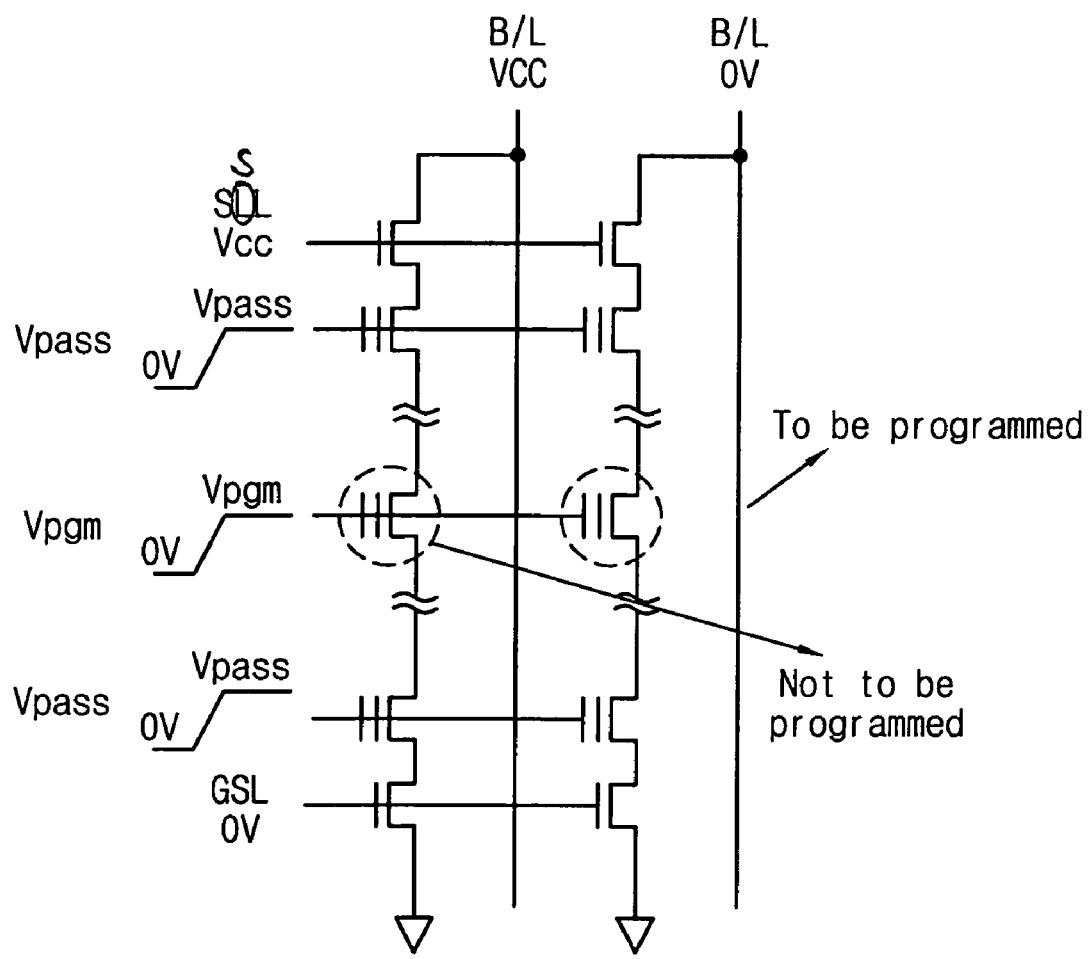
FIG. 5 illustrates how programming of a memory cell connected to a selected word line is inhibited by charging the associated bit line for the memory cell to $V_{CC}$.
Figure 6:
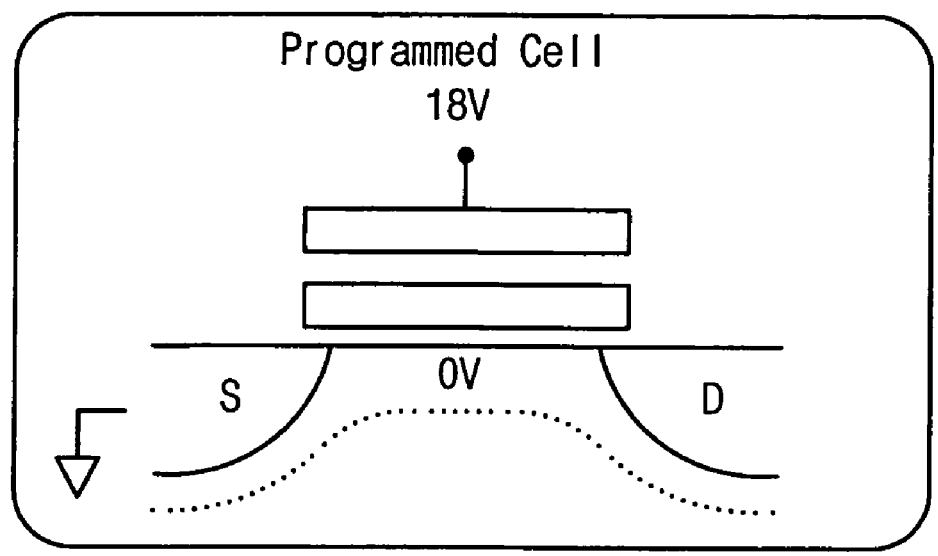
FIG. 6 illustrates coupling between a gate and a channel in a NAND flash memory cell program operation.
Figure 6:
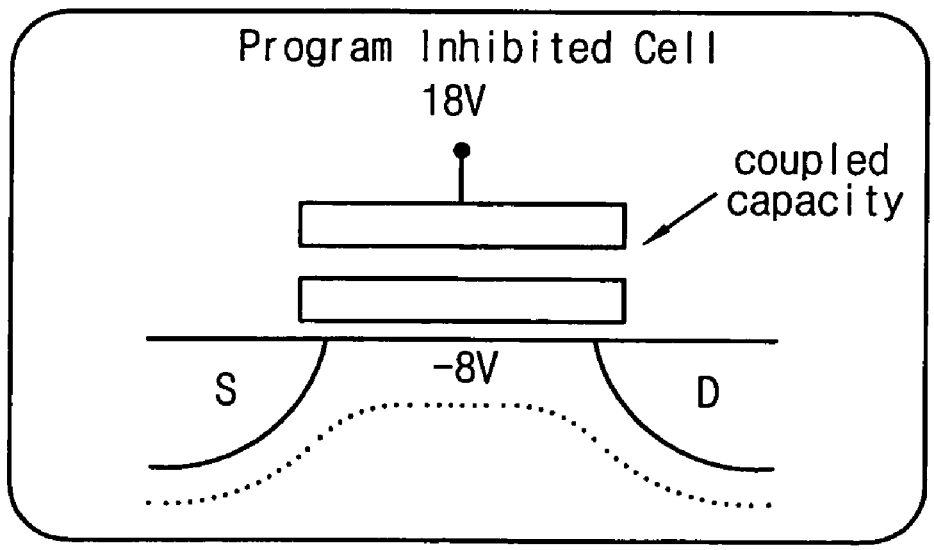
Figure 7:
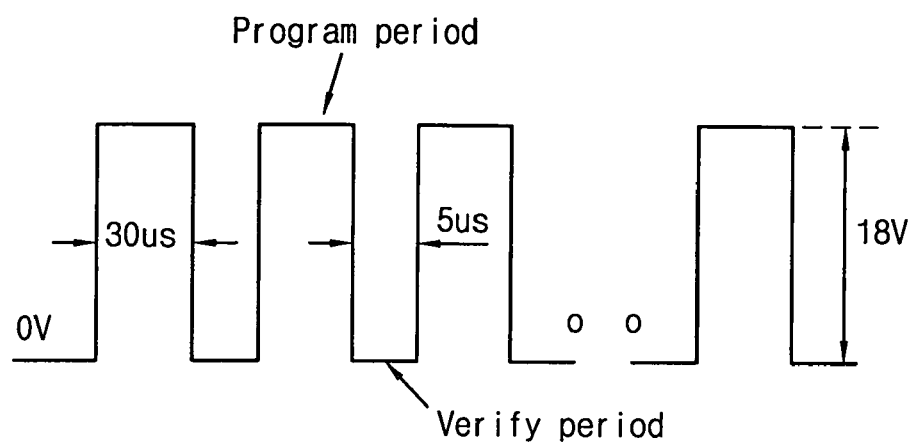
FIG. 7 illustrates a pulse programming sequence for programming a flash memory cell.
Figure 8:
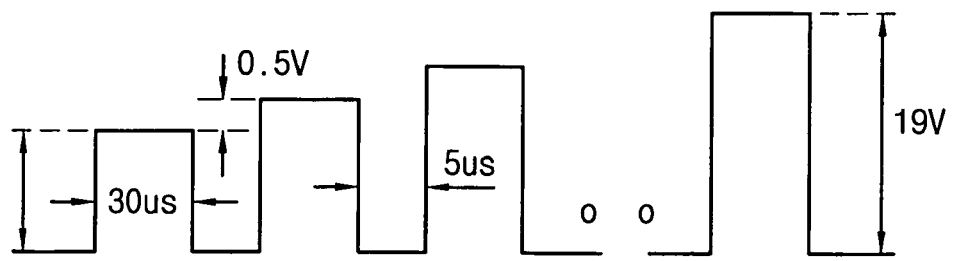
FIG. 8 illustrates an incremental step pulse programming (ISPP) sequence for programming a flash memory cell.
Figure 9:
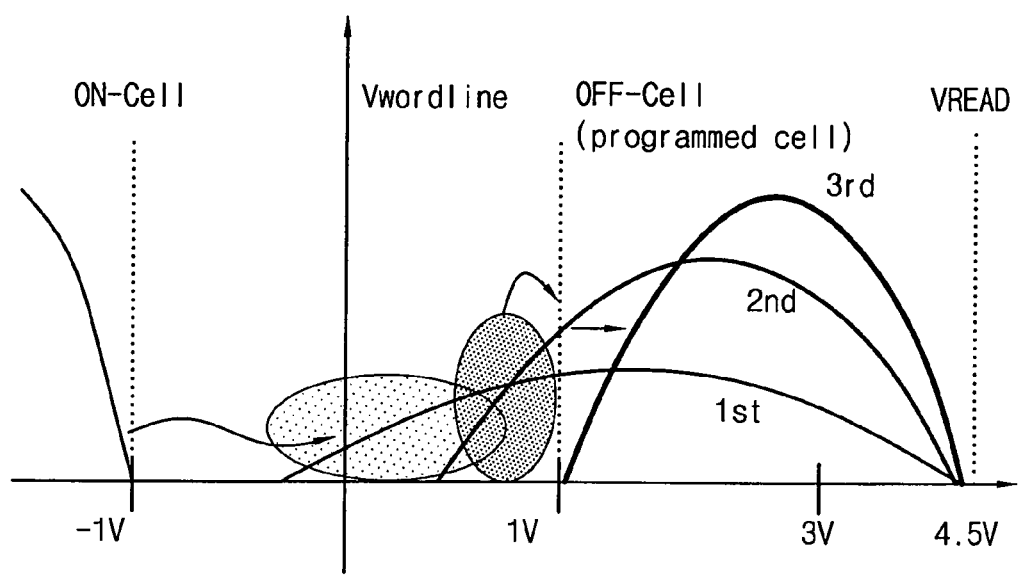
FIG. 9 illustrates how the distribution of threshold voltages for memory cells of a flash memory device are changed as a result of each voltage pulse of an ISPP sequence.
Figure 10:
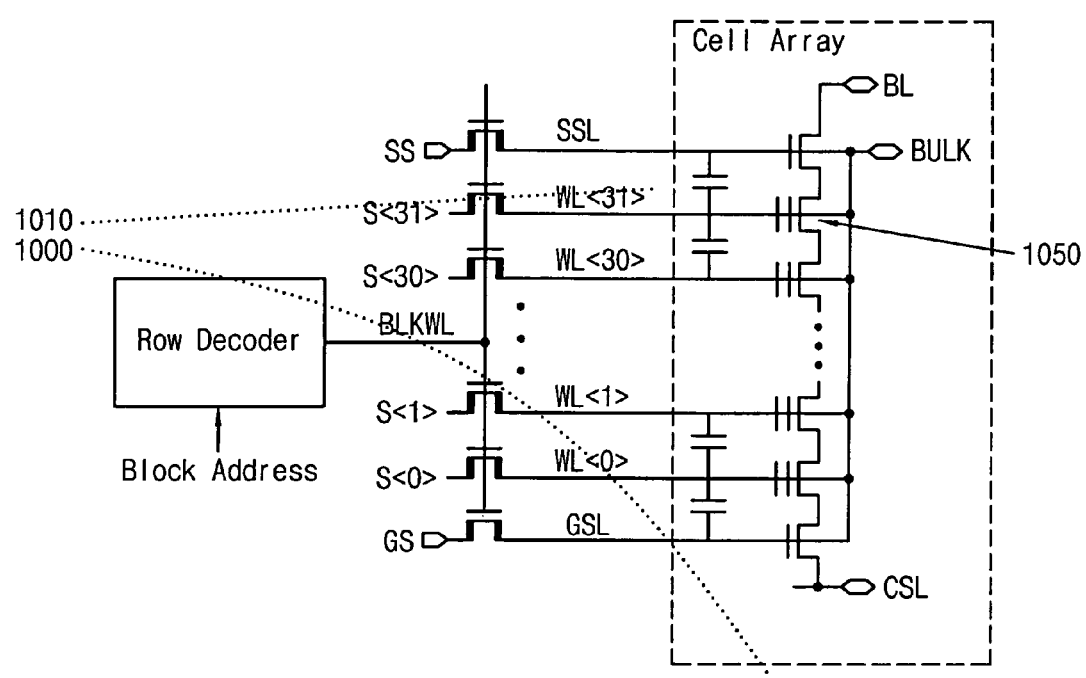
FIG. 10 shows a flash memory cell string, illustrating parasitic coupling capacitances that exist between the word lines connected to the various memory cells of the string.
Figure 11:
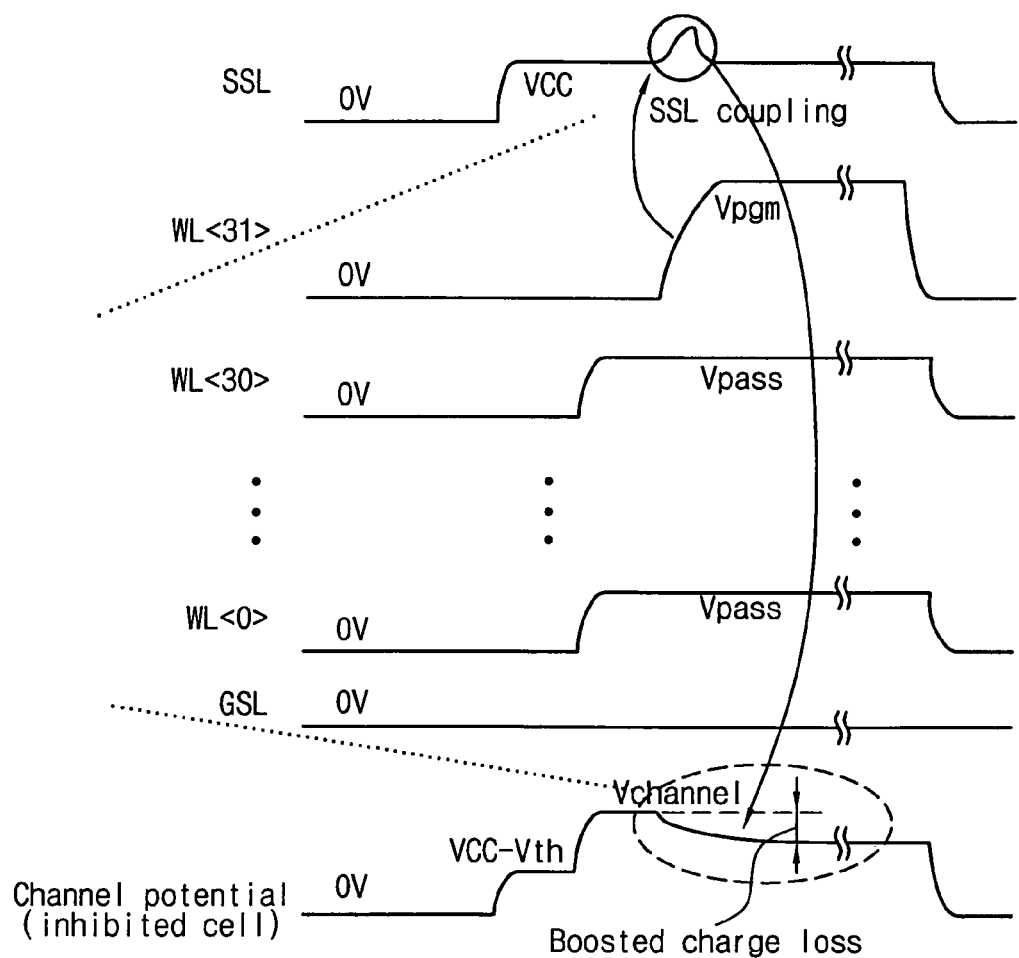
FIG. 11 illustrates the effect of the coupling capacitance between a string select line and a nearby selected word line when a program voltage pulse is applied to the selected word line.
Figure 12:
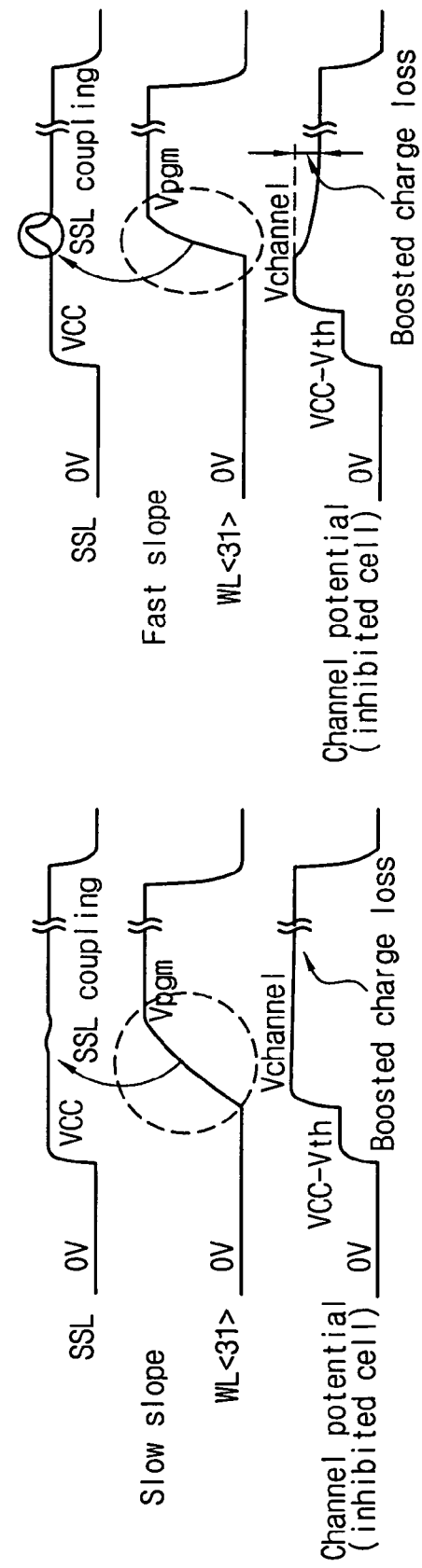
FIG. 12 illustrates how decreasing a slope of a word line voltage pulse can prevent a problem from occurring which may cause a program inhibit function to fail.
Figure 13:
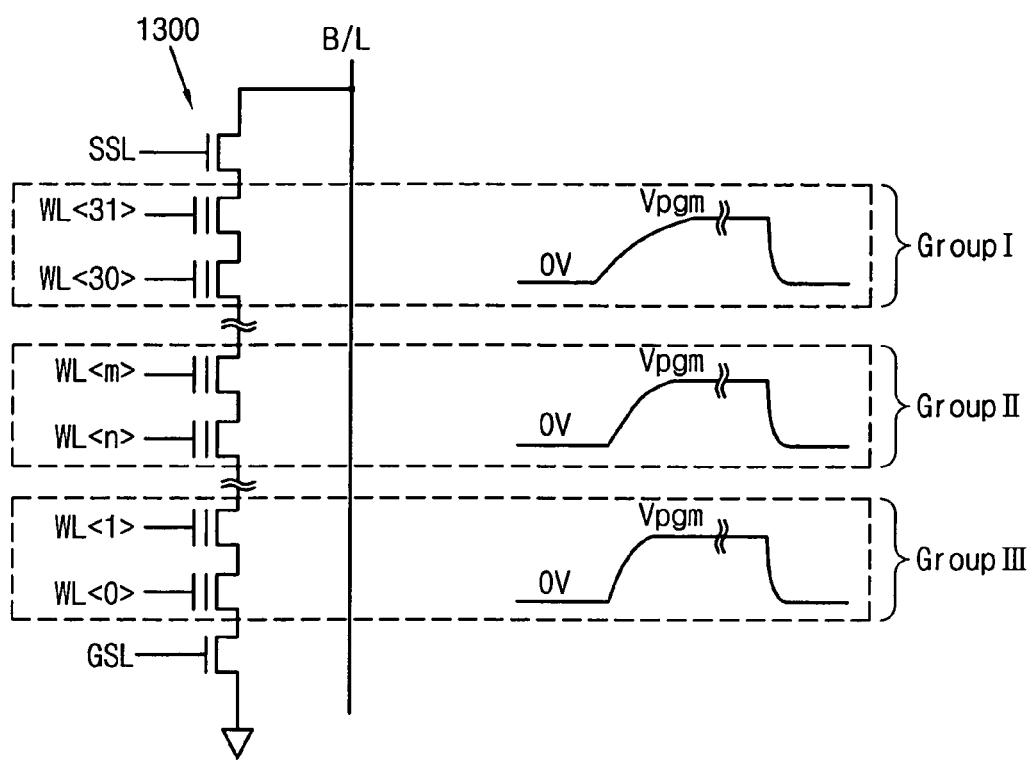
FIG. 13 shows a memory cell string of a non-volatile memory device, and voltage pulses used for programming corresponding memory cells of the string.

FIG. 13 shows an embodiment of a memory cell string 1300 of a non-volatile (e.g., flash) memory device, and programming (voltage) pulses used for programming corresponding memory cells in string 1300. As can be seen in FIG. 13, the slope or rise time of a programming pulse is made to be different for different word lines connected to different memory cells in string 1300. In particular, in the embodiment of FIG. 13 the slope of programming pulses for word lines 30-31 located near the SSL is made to be less than the slope of programming pulses for word lines 0-29 that are not located near the SSL. Accordingly, the voltage pulses applied to a selected word line near the SSL can have a reduced slope (longer rise time) so as to prevent a large spike from being capacitively coupled onto a control gate of the SST which might otherwise cause a program inhibit function to fail. Meanwhile, a selected word line that is located far enough away from the SSL to prevent a problem (coupling to SSL is very low), can be driven with a voltage pulse having an increased slope (faster rise time) so as to increase the programming speed of the memory device.

Figure 14:
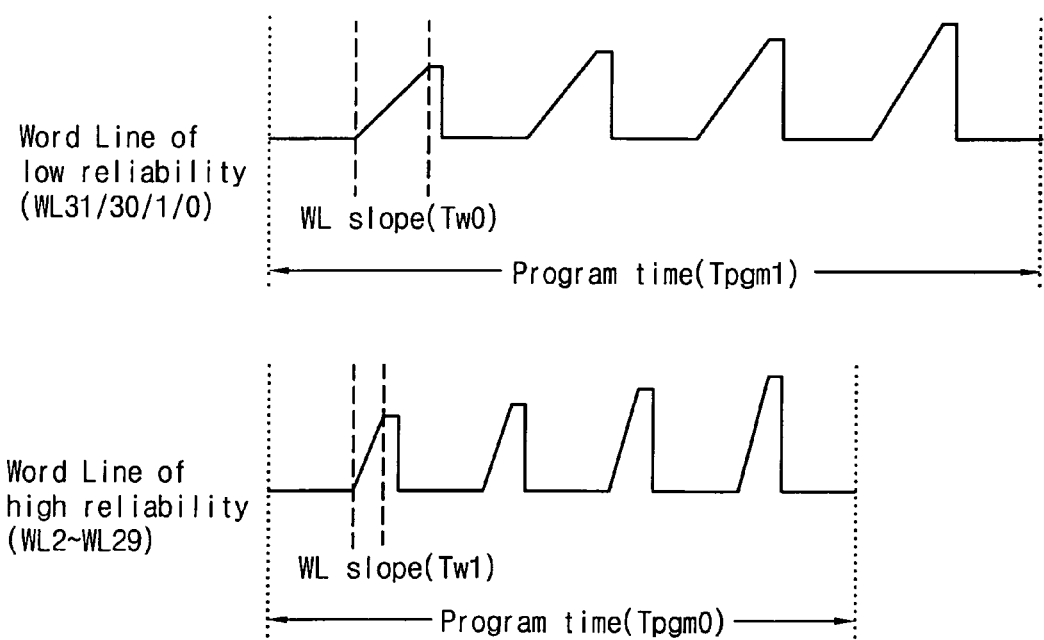
FIG. 14 shows one embodiment of first and second sequences of voltage pulses that maybe applied to different word lines of a memory device.

FIG. 14 shows an embodiment of voltage pulses used for programming memory cells in a non-volatile (e.g., flash) memory device where the word lines are divided into two sets. In the embodiment illustrated in FIG. 14, the word lines of a non-volatile (e.g., flash) memory device are divided into a first set including word lines (e.g., word lines 0-29) not located near the SSL, and a second set including one or more word line(s) (e.g., word lines 30-31) located near the SSL. As can be seen, the incremental step pulse program (ISPP) technique is employed for both word line sets. However, the slope of one or more of the voltage pulses in a first sequence of voltage pulses (first ISSP pattern) for the first set of word lines is greater than the slope of the voltage pulses in a second sequence of voltage pulses (second ISSP pattern) for the second set of word lines. As a result, the program inhibit function can be guaranteed to work properly for all word lines, and the total block program time is only increased a little compared to a device which uses the second ISSP pattern for all word lines. In particular, for a string having a length of 32 memory cells, if the program time of a series of voltage pulses of the first ISSP pattern is $T_{PGM1}$, and if the program time of a series of voltage pulses of the second ISSP pattern is $T_{PGM2}$, then the total block program time, $T_{BLOCK}=60*T_{PGM1}+4*T_{PGM2}$. Optionally, the word lines could instead be divided into three sets, or even more sets as desired, with a different sequence of voltage pulses being applied to a selected word line belonging to each set.

Figure 15:
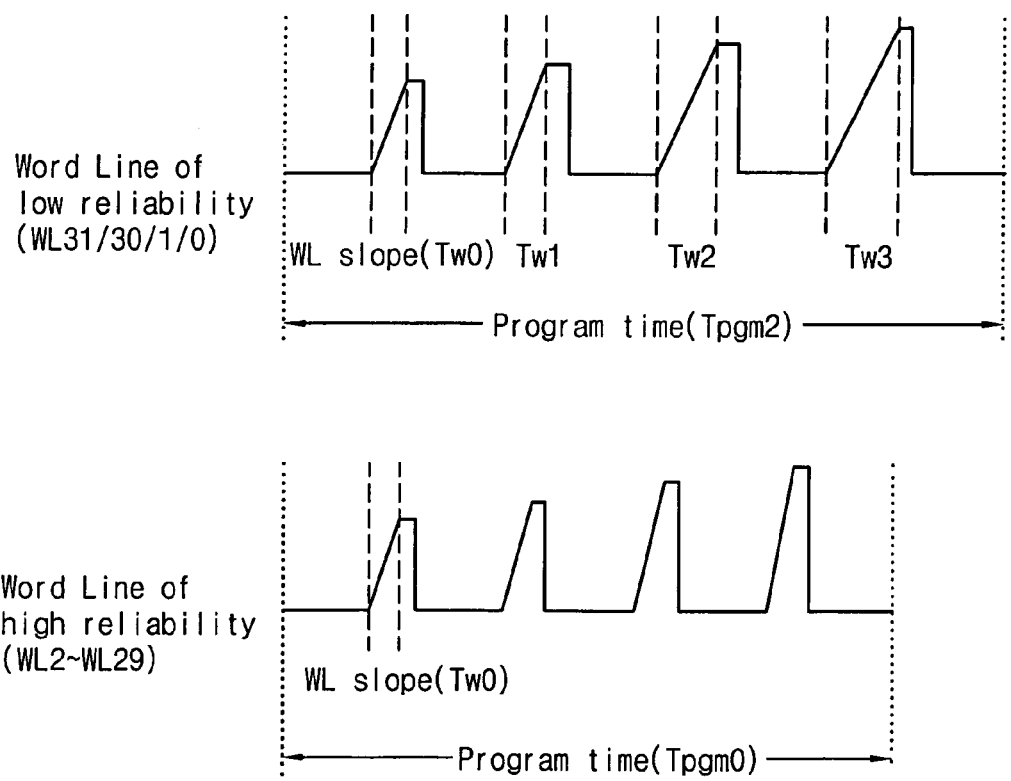
FIG. 15 shows another embodiment of first and second sequences of voltage pulses that maybe applied to different word lines of a memory device.

FIG. 15 shows another embodiment of voltage pulses used for programming memory cells in a non-volatile (e.g., flash) memory device where the word lines are divided into two sets. In the embodiment illustrated in FIG. 15, the slopes of all of the voltage pulses in the second sequence of voltage pulses (second ISSP pattern) are different from each other. However, the slope of at least one of the voltage pulses of the first sequence of voltage pulses in FIG. 15 (for word lines that are not near the SSL) is greater than the slope of at least one (and perhaps all) of the voltage pulses of the second sequence of voltage pulses (for one or more word line(s) near the SSL). Beneficially, the slopes of all of the voltage pulses in the first sequence of voltage pulses may be greater than the slopes of any of the voltage pulses in the second sequence of voltage pulses of FIG. 15.

Figure 16:
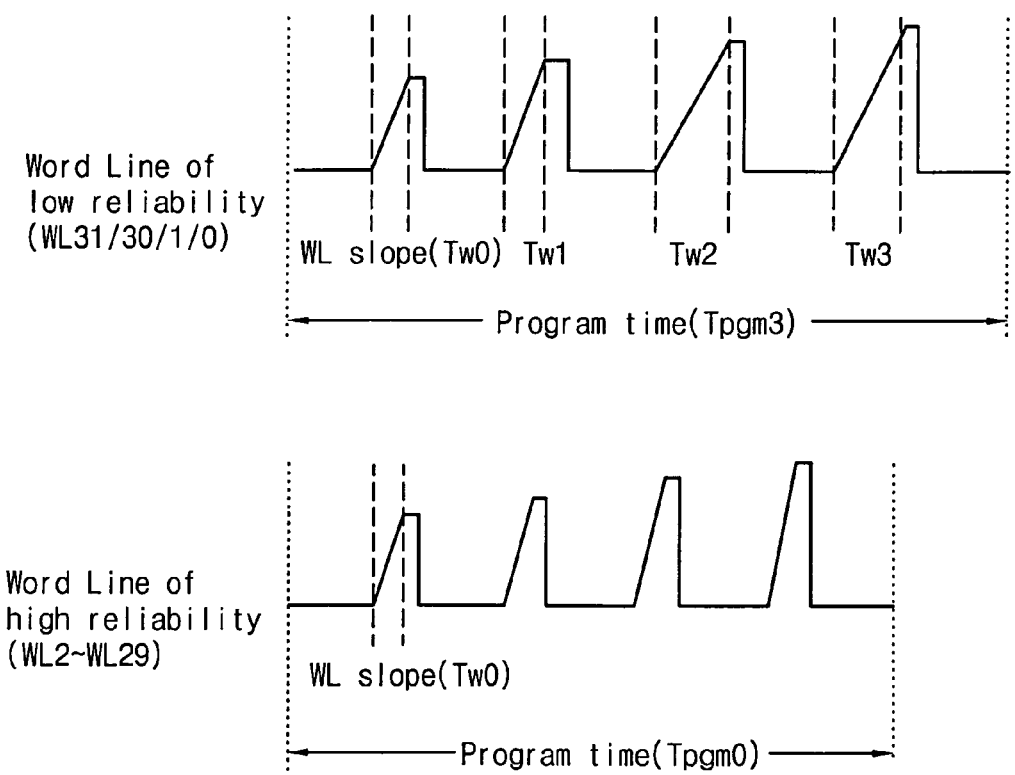
FIG. 16 shows another embodiment of first and second sequences of voltage pulses that maybe applied to different word lines of a memory device.

FIG. 16 shows yet another embodiment of voltage pulses used for programming memory cells in a non-volatile (e.g., flash) memory device where the word lines are divided into two sets. In the embodiment illustrated in FIG. 16, the slopes of at least two of the voltage pulses in the first ISSP pattern are the same as each other. Indeed, it is possible that all of the voltage pulses in the first ISSP pattern are the same as each other. However, once again, the slope of at least one of the voltage pulses of the first sequence of voltage pulses in FIG. 16 (for word lines that are not near the SSL) is greater than the slope of at least one (and perhaps all) of the voltage pulses of the second sequence of voltage pulses (for one or more word line(s) that are near to the SSL). Again, beneficially, the slopes of all of the voltage pulses in the first sequence of voltage pulses may be greater than the slopes of any of the voltage pulses in the second sequence of voltage pulses of FIG. 16.

Figure 17:
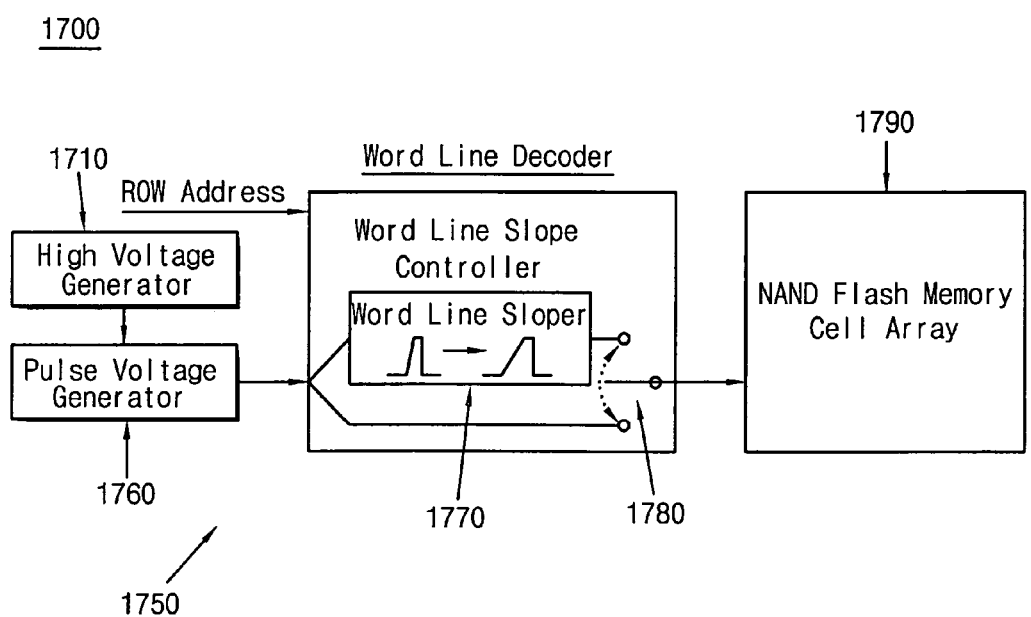
FIG. 17 shows a high-level function block diagram of a non-volatile memory device.

FIG. 17 shows a high-level functional diagram of relevant parts of one embodiment of a non-volatile (e.g., flash) memory device 1700. Among other elements (not shown), memory device 1700 includes a high voltage generator 1710, a word line voltage generator 1750 and a NAND flash memory cell array 1790. Word line voltage generator 1750 includes a pulse voltage generator 1760, a word line slope controller 1770, and a multiplexer 1780.

High voltage generator 1710 generates a high voltage (e.g., 18 volts) that is used for programming a memory cell, and provides the high voltage to step voltage generator 1760. Pulse voltage generator 1760 generates a first sequence of voltage pulses to be applied to a selected word line for programming memory cells of NAND flash memory cell array 1790. Beneficially, pulse voltage generator 1760 outputs the first sequence of voltage pulses according to the incremental step pulse program (ISPP) technique. Word line slope controller 1770 receives the first sequence of voltage pulses and controls the slope of at least one of the voltage pulses of the first sequence to thereby generate a second sequence of voltage pulses. Beneficially, the first and second sequences of voltage pulses may be any of the pairs of sequences shown in any of FIGS. 14-16 above. Multiplexer 1780 receives the first and second sequences of voltage pulses, and outputs one of the first and second sequence of voltage pulses depending on the selected word line as indicated by the ROW address. In particular, when the ROW address indicates a selected word line that is not near the SSL ("first set of word lines"), then multiplexer 1780 outputs the first sequence of voltage pulses. Meanwhile, when the ROW address indicates a selected word line that is near the SSL ("second set of word line(s)"), then multiplexer 1780 outputs the second sequence of voltage pulses from word line slope controller 1770.

As noted above, FIG. 17 is a high-level functional diagram, and so the arrangement of elements shown in FIG. 17 is illustrative. For example, although the embodiment of FIG. 17 shows multiplexer 1780 at an output of word line slope controller 1770, alternatively the multiplexer function could be performed at the input of word line slope controller 1770, or as explained below, the multiplexer function could be performed by selectively changing the slope provided by word line slope controller 1770 to thereby generate the first and second sequences of voltage pulses.

Figure 18:
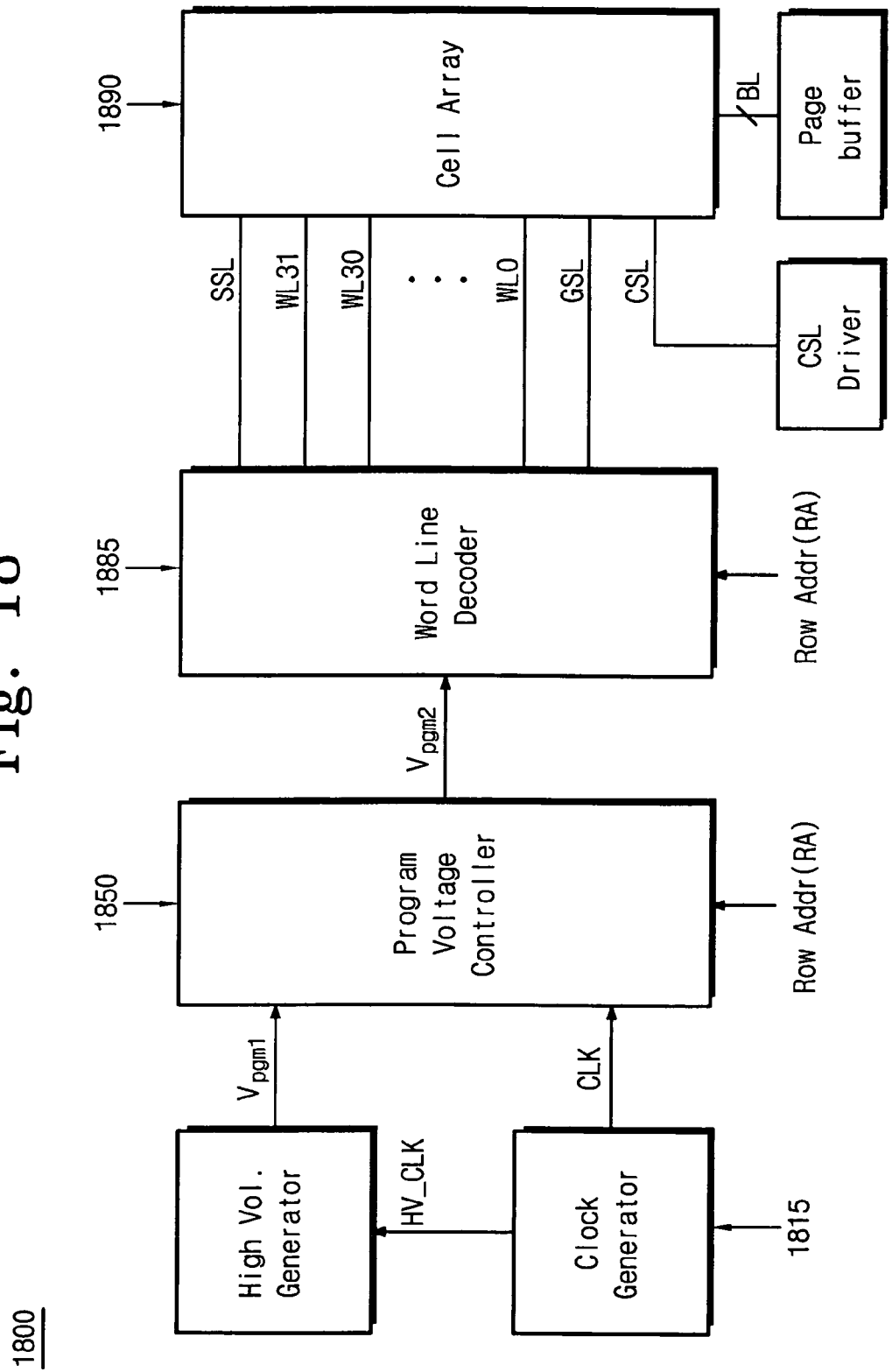
FIG. 18 shows a detailed block diagram of a non-volatile memory device.

FIG. 18 shows a detailed block diagram of relevant parts of one embodiment of a non-volatile (e.g., flash) memory device 1800. Among other elements (not shown), memory device 1800 includes a clock generator 1815, a word line voltage generator 1850, a word line decoder 1885, and a NAND flash memory cell array 1890. Word line voltage generator 1850 includes a pulse voltage generator and a word line slope controller.

Figure 19:
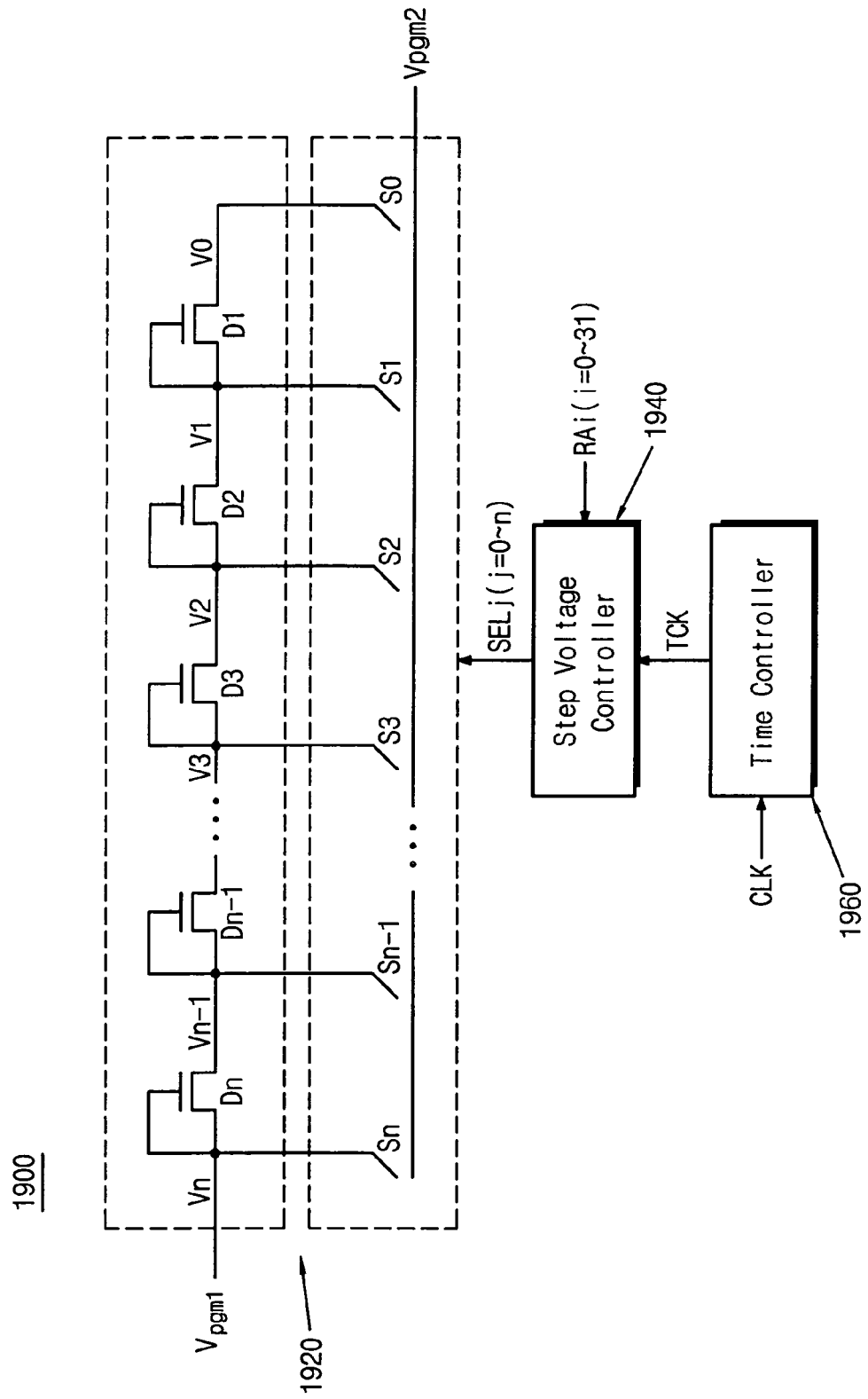
FIG. 19 shows a detailed block diagram of a first embodiment of a word line voltage generator.

FIG. 19 shows a detailed block diagram of a first embodiment of a word line voltage generator 1900. Word line voltage generator 1900 includes a voltage ladder 1920, a step voltage controller 1940, and a time controller 1960. Voltage ladder 1920 receives a sequence of voltage pulses $V_{PGM1}$, and produces therefrom a plurality of voltages, V0, V1, V2, . . . , Vn-1. Time controller 1960 outputs a clock signal having a plurality of substantially equal time periods. Step voltage controller 1940 receives the clock signal from time controller 1960 and selects a voltage from voltage ladder 1920 in each of a plurality of time periods to control the slope of at least one of the voltage pulses in response to a ROW address corresponding to the selected word line. That is, step voltage controller 1940 sets a magnitude of the voltage in each clock period according to the ROW address of the selected word line, and thereby controls a slope (rise time) of the voltage pulse according to the position of the selected word line.

Figure 20:
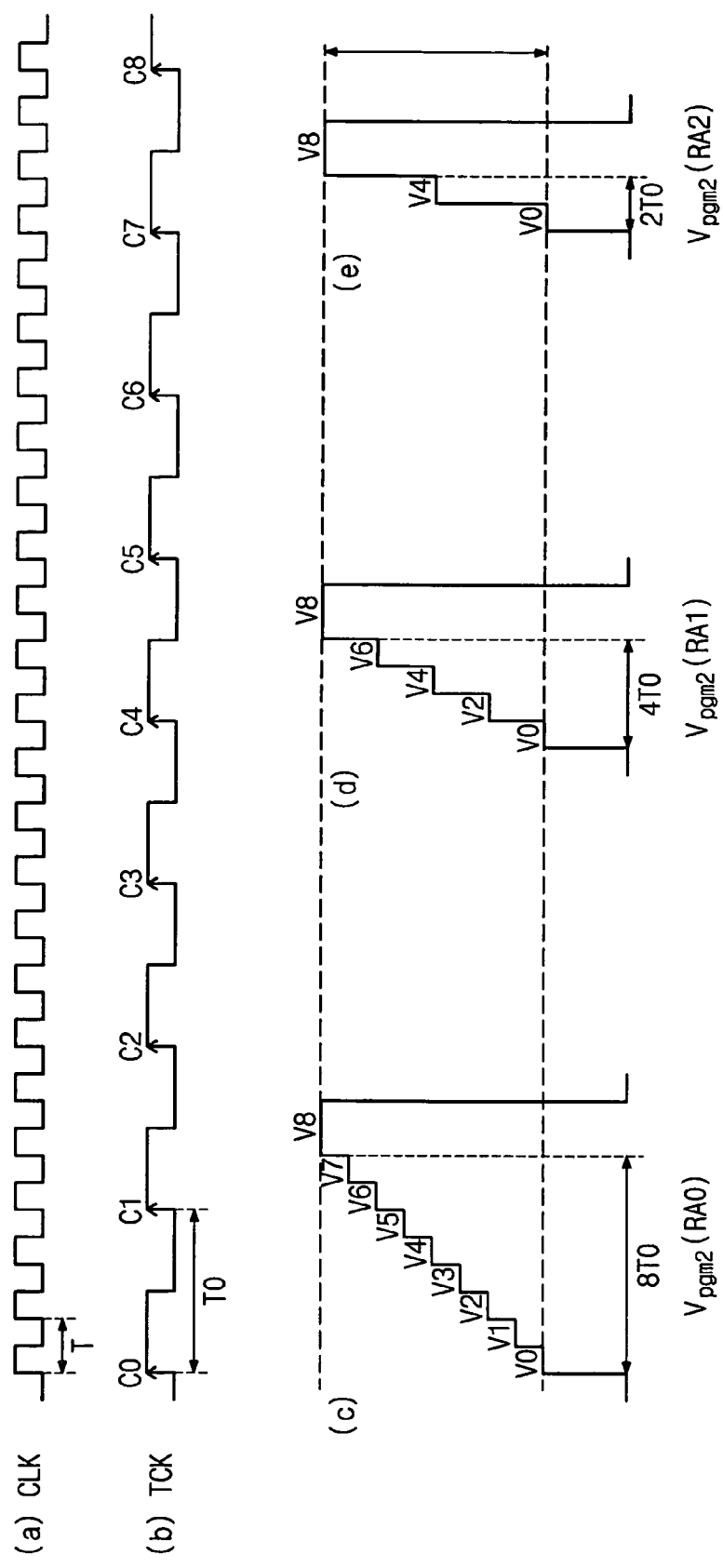
FIG. 20 shows voltage pulses that may be produced by the word line voltage generator of FIG. 19.

In particular, as shown in FIG. 20, when the ROW address indicates that the selected word line is not near the SSL (e.g., word lines 0-29), then voltage controller 1940 outputs larger voltage steps in each clock period to produce a voltage pulse $V_{PGM2}$ as shown in the example at the far right in FIG. 20. Optionally, voltage controller 1940 takes a largest possible step to V8 in the first clock period, and maintains the voltage at V8 for the duration of the voltage pulse $V_{PGM1}$. Accordingly, in this case word line voltage generator 1900 outputs a first sequence of voltage pulses having relatively large slopes. On the other hand, when the ROW address indicates that the selected word line is near the SSL (e.g., word lines 30 or 31), then voltage controller 1940 outputs smaller voltage steps in each clock period to produce a voltage pulse $V_{PGM2}$ as shown in the example at the far left in FIG. 20. Accordingly, in this case word line voltage generator 1900 outputs a second sequence of voltage pulses having relatively reduced slopes.

Figure 21:
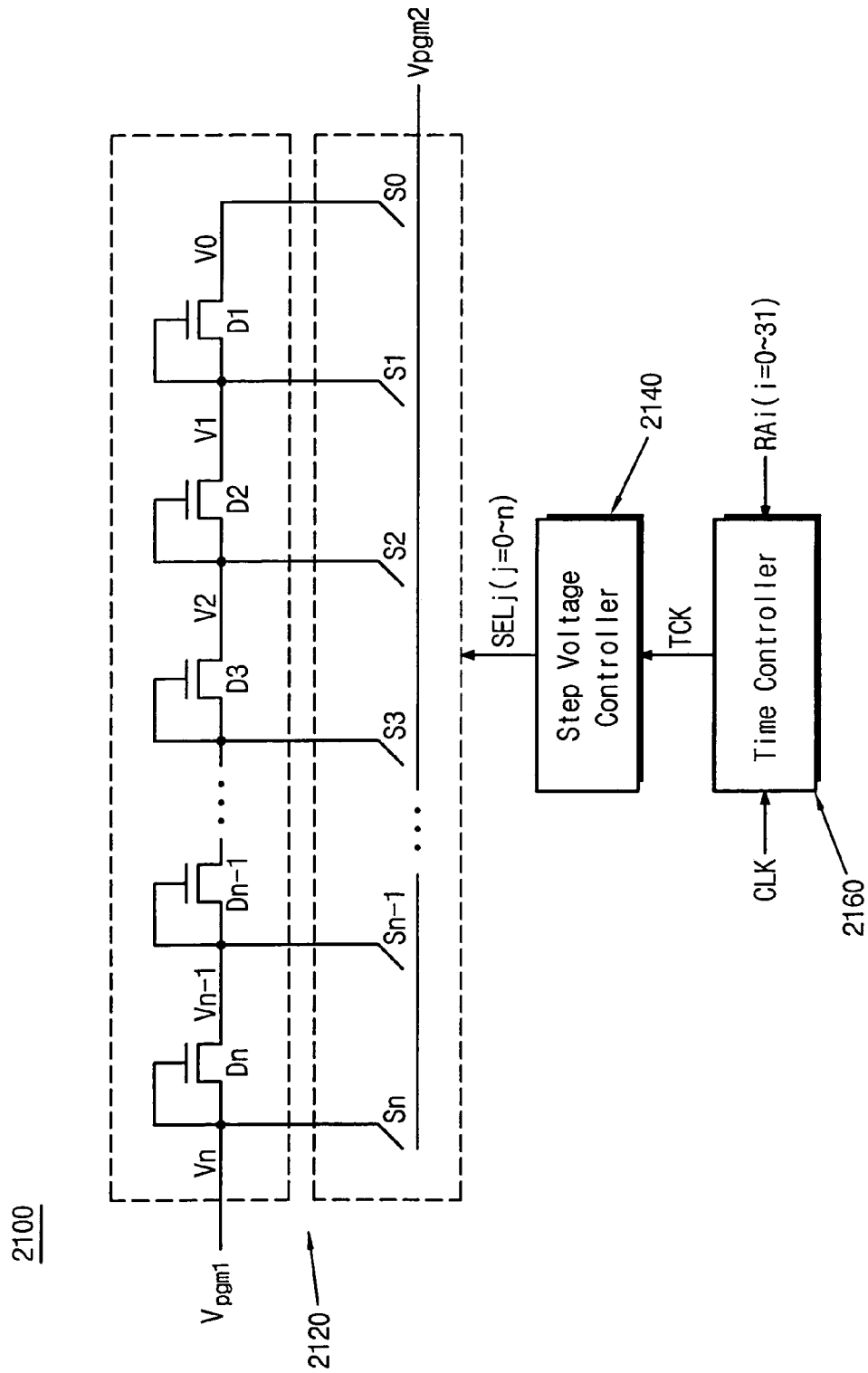
FIG. 21 shows a detailed block diagram of a second embodiment of a word line voltage generator.

FIG. 21 shows a detailed block diagram of a second embodiment of a word line voltage generator 2100. Word line voltage generator 2100 includes a voltage ladder 2120, a step voltage controller 2140, and a time controller 2160. Voltage ladder 2120 receives a sequence of voltage pulses $V_{PGM1}$, and produces therefrom a plurality of voltages, V0, V1, V2, . . . , Vn-1. Time controller 2160 outputs a clock signal having a plurality of time periods. Step voltage controller 2140 receives the clock signal from time controller 2160 and in response thereto increments the voltage from voltage ladder 2120 by a predetermined amount in each of the plurality of time periods. Beneficially, time controller 2160 sets the time periods to control the slope of at least one of the voltage pulses in response to a row address corresponding to the selected word line. That is, time controller 2160 sets a time period of each clock period according to the ROW address of the selected word line, and thereby controls a slope (rise time) of the voltage pulse according to the position of the selected word line.

Figure 22:
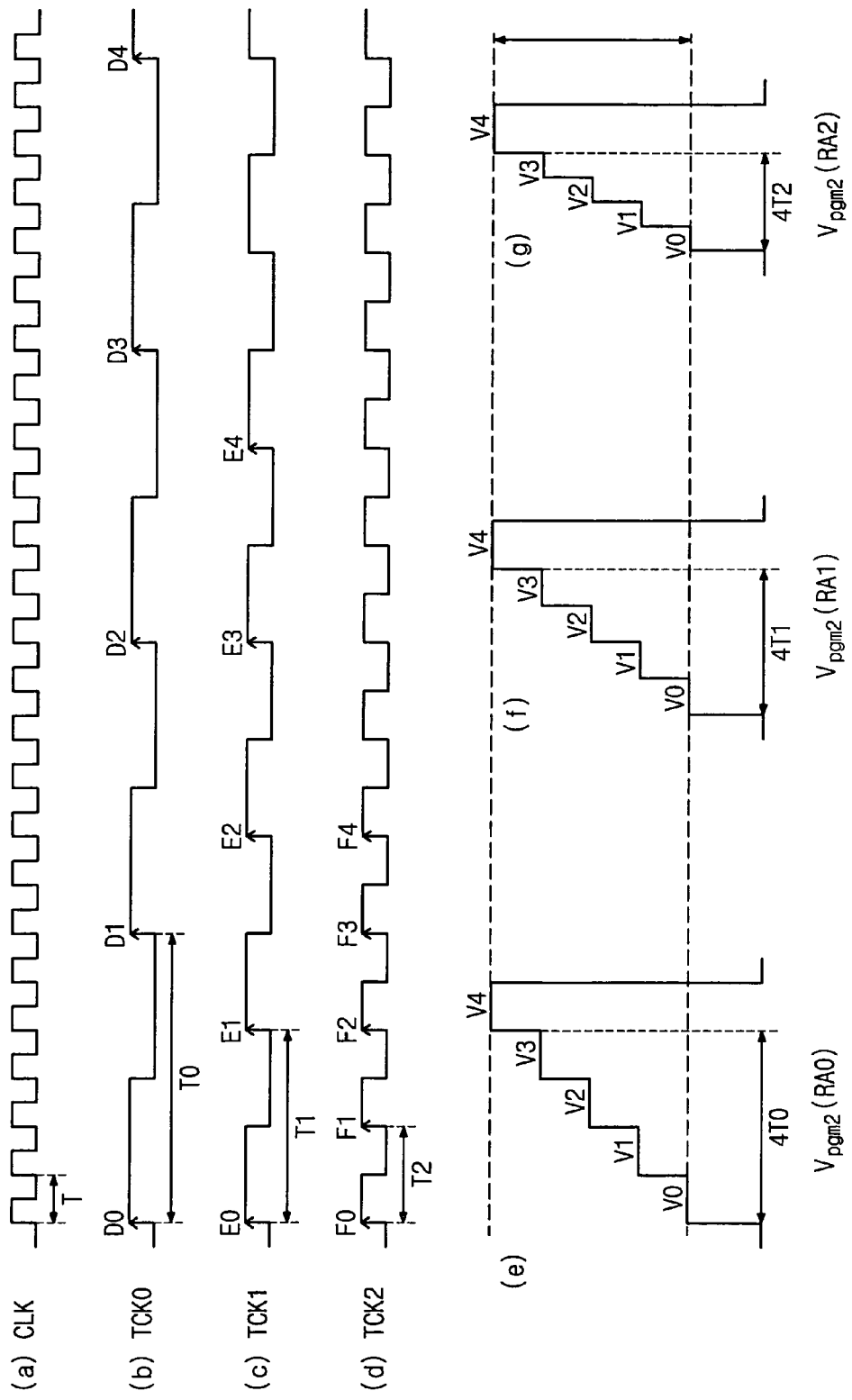
FIG. 22 shows voltage pulses that may be produced by the word line voltage generator of FIG. 21.

In particular, as shown in FIG. 22, when the ROW address indicates that the selected word line is not near the SSL (e.g., word lines 0-29), then time controller 2160 sets each clock period to be very short to produce a voltage pulse $V_{PGM2}$ as shown in the example at the far right in FIG. 22. Accordingly, in this case word line voltage generator 2100 outputs a first sequence of voltage pulses having relatively large slopes. On the other hand, when the ROW address indicates that the selected word line is near the SSL (e.g., word lines 30 or 31), then time controller 2160 sets each clock period to be longer so as to produce an output pulse having a voltage pulse $V_{PGM2}$ as shown in the example at the far left in FIG. 22. Accordingly, in this case word line voltage generator 2100 outputs a second sequence of voltage pulses having relatively reduced slopes.

Figure 23:
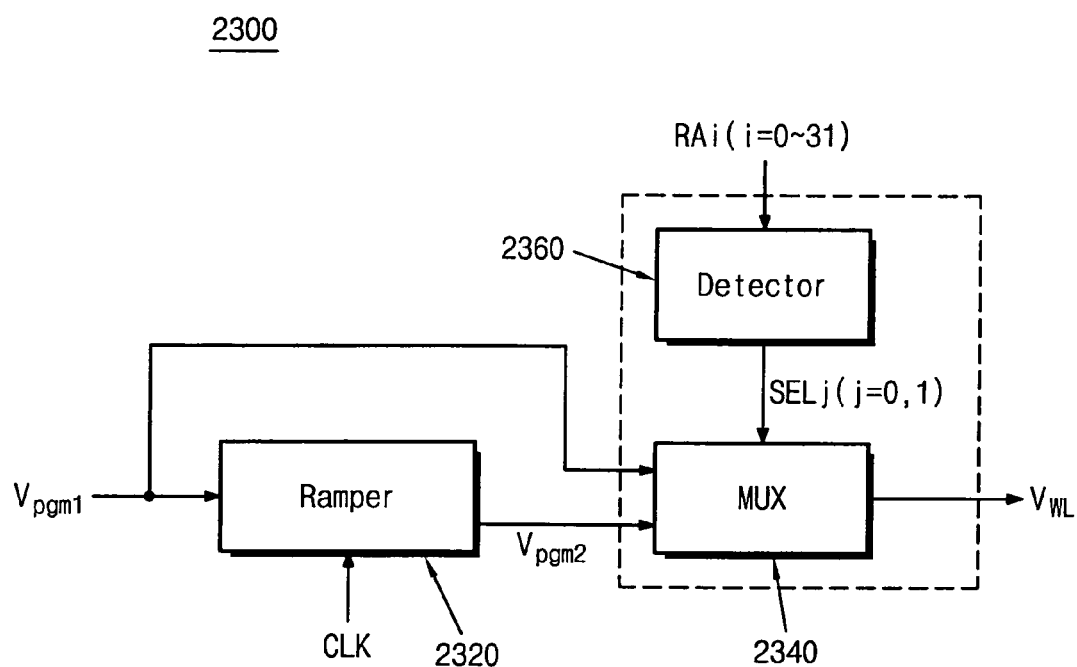
FIG. 23 shows a detailed block diagram of a third embodiment of a word line voltage generator.

The first and second embodiments of FIGS. 19-22 are particularly well-suited to a case where the word lines are divided into more than two sets. Indeed, in these embodiments it is possible that each word line is treated separately depending upon its distance fro the string select line, with a different sequence of voltage pulses having a different collection of slopes being generated for each word line. In that case, beneficially, the slope of at least one of the voltage pulses of a second sequence of voltage pulses for a word line nearer to the SSL is less than the slope of at least one of the voltage pulses of a first sequence of voltage pulses for a word line that is further away from the SSL. Beneficially, the slopes of all of the voltage pulses in the first sequence of voltage pulses may be greater than the slopes of any of the voltage pulses in the second sequence of voltage pulses FIG. 23 shows a detailed block diagram of a third embodiment of a word line voltage generator 2300. Word line voltage generator 2300 includes a pulse voltage generator (not shown), a word line slope controller 2320, a multiplexer 2340, and a word line detector 2360. The pulse voltage generator generates a first sequence of voltage pulses $V_{PGM1}$ to be applied to a selected word line for programming memory cells of a nonvolatile memory cell array (also not shown). Beneficially, the pulse voltage generator outputs the first sequence of voltage pulses according to the incremental step pulse program (ISPP) technique. Word line slope controller 2320 receives the first sequence of voltage pulses $V_{PGM1}$ and controls the slope of at least one of the voltage pulses $V_{PGM1}$ of the first sequence to thereby generate a second sequence of voltage pulses $V_{PGM2}$. Beneficially, the first and second sequences of voltage pulses $V_{PGM1}$ and $V_{PGM2}$ may be any of the pairs of sequences shown in any of FIGS. 14-16 above. Multiplexer 2340 receives the first and second sequences of voltage pulses $V_{PGM1}$ and $V_{PGM2}$, and outputs one of the first and second sequence of voltage pulses $V_{PGM1}$ and $V_{PGM2}$ depending on the selected word line as detected by word line detector 2360. In particular, when word line detector 2360 detects a selected word line that is not near the SSL ("first set of word lines"), then it controls multiplexer 2340 to output the first sequence of voltage pulses $V_{PGM1}$. Meanwhile, when word line detector 2360 detects a selected word line that is near the SSL ("second set of word line(s)"), then it controls multiplexer 2340 to output the second sequence of voltage pulses $V_{PGM2}$ from word line slope controller 2320.

Although the embodiment of FIG. 23 shows multiplexer 2340 at an output of word line slope controller 2320, alternatively the multiplexer could be installed at the input of word line slope controller 2320. Furthermore, the multiplexer could be integrated into a multiplexer of the word line decoder 1885 of FIG. 18.

Figure 24:
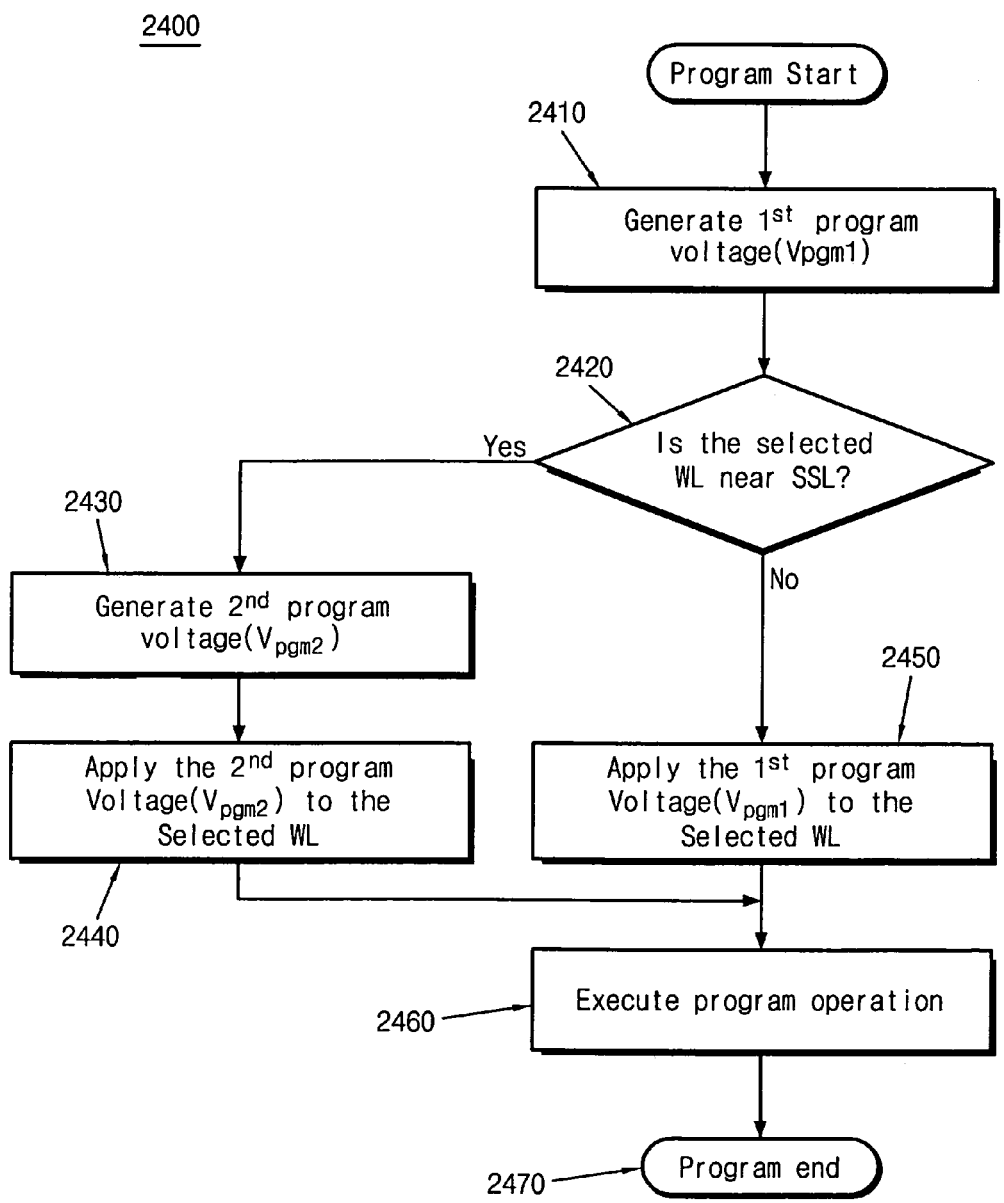
FIG. 24 is a flowchart of a method of programming a non-volatile memory device.

FIG. 24 is a flowchart of a method 2400 of programming a non-volatile (e.g., flash) memory device. In a first step 2410, a first sequence of voltage pulses $V_{PGM1}$ is generated. The voltage pulses $V_{PGM1}$ of the first sequence have a first slope. Beneficially, the voltage pulses of the first sequence have a series of increasing amplitudes according to an ISPP technique.

In a step 2420, it is determined whether the selected word line is near a SSL.

If it is determined in step 2420 that the selected word line is near a SSL. Then in a step 2430 a second sequence of voltage pulses $V_{PGM2}$ is generated. The voltage pulses $V_{PGM2}$ of the second sequence have a second slope. At least one of the voltage pulses $V_{PGM1}$ of the first sequence has a greater slope than at least one of the voltage pulses $V_{PGM2}$ of the second sequence. Beneficially, the voltage pulses $V_{PGM2}$ of the second sequence have a series of increasing amplitudes according to an ISPP technique.

Then, in a step 2440 the second sequence of voltage pulses $V_{PGM2}$ is applied to the selected word line.

Meanwhile, if it is determined in step 2420 that the selected word line is not near a SSL, then in a step 2450 the first sequence of voltage pulses $V_{PGM1}$ is applied to the selected word line.

Next, in a step 2460 the memory cell programming operation is executed.

Finally, in a step 2470, the programming operation ends.

Figure 25:
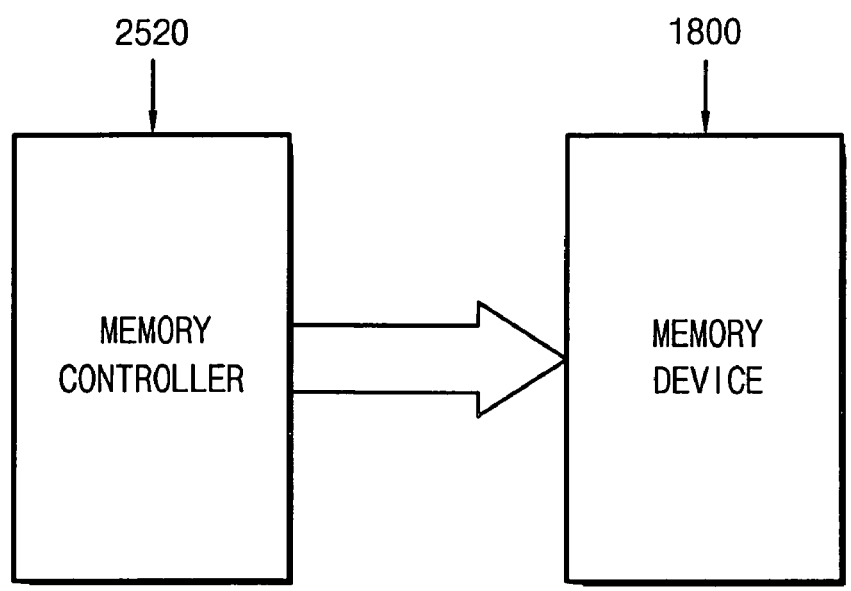
FIG. 25 is a block diagram of a memory system.

FIG. 25 shows a memory system 2500 including memory controller 2520 and non-volatile (e.g., flash) memory device 1800 that selectively supplies either a first sequences of voltage pulses or a second sequences of voltage pulses to a selected word line to program the nonvolatile memory cells connected to the selected word line, wherein the slope of at least one voltage pulse of the first sequence of voltage pulses is greater than the slope of at least one voltage pulse of the second sequence of voltage pulses.

Memory controller 2520 supplies an address for writing data to one or more nonvolatile memory cells connected to the selected word line. Memory device 1800 receives the address from memory controller 2520, and word line decoder 1885 decodes the address to determine a corresponding word line to be selected for programming the memory cells connected thereto. Beneficially, as explained above when memory device 1800 detects that the selected word line is not near the SSL ("first set of word lines"), then word line voltage generator 1850 outputs to the selected word line a first sequence of voltage pulses $V_{PGM1}$. Meanwhile, when word line detector 2360 detects that the selected word line is near the SSL ("second set of word line(s)"), then word line voltage generator 1850 outputs to the selected word line a first sequence of voltage pulses $V_{PGM1}$ where a slope of at least one voltage pulse of the first sequence of voltage pulses is greater than a slope of at least one voltage pulse of the second sequence of voltage pulses. Beneficially, the first and second sequences of voltage pulses may be the sequences shown in any of FIGS. 14-16 above.

Figure 26:
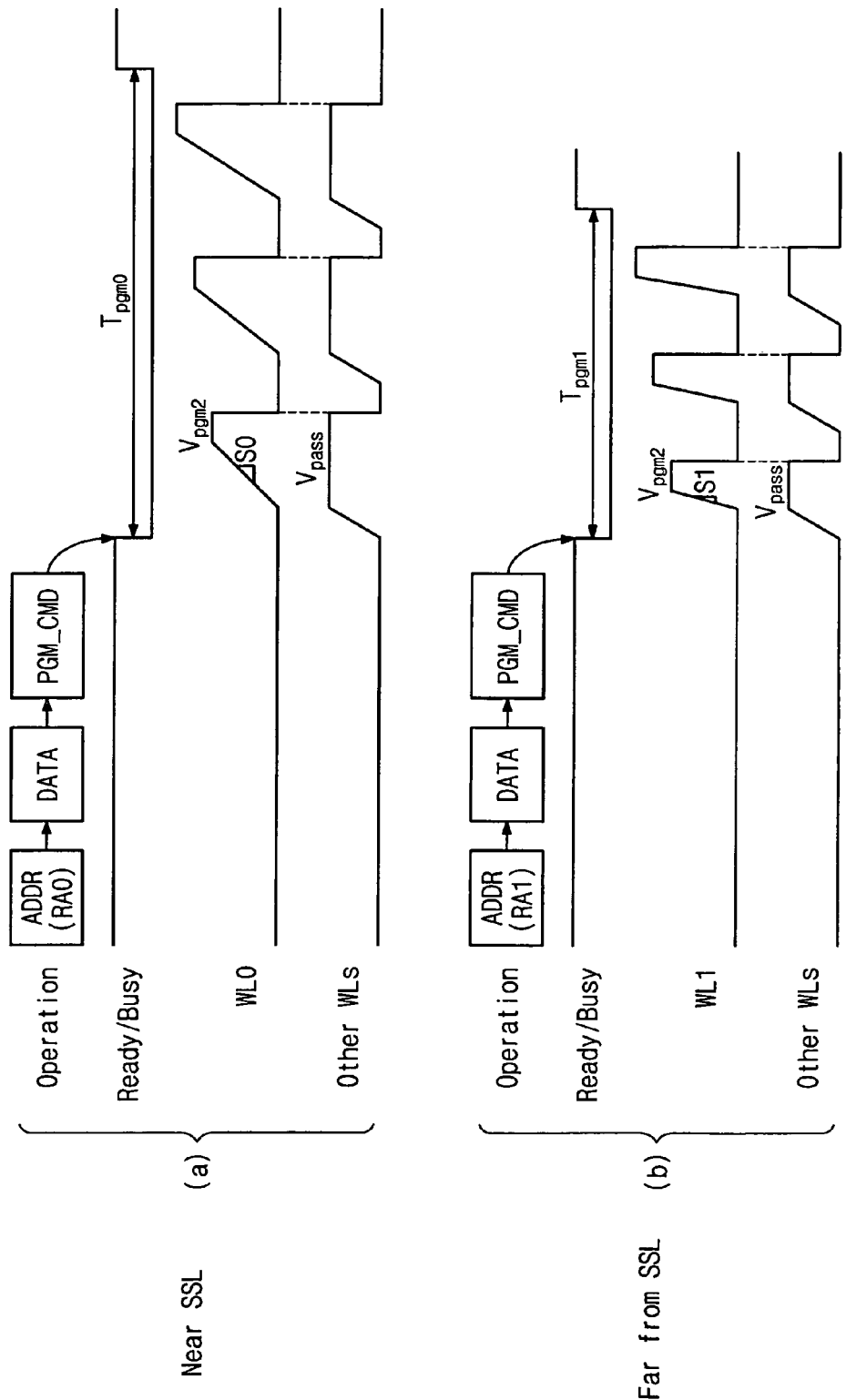
FIG. 26 illustrates programming operations for a memory device that employs a first sequence of voltage pulses for a first set of word lines, and a second sequence of voltage pulses for a second set of word lines.

FIG. 26 summarizes the programming condition for word lines in the memory device. As seen in FIG. 26, the programming time $T_{PGM1}$ for a first sequence of voltage pulses when a selected word line is far from the SSL is less than the programming time $T_{PGM2}$ for a second sequence of voltage pulses when a selected word line is near the SSL. However, by reducing the slope of the voltage pulses of the second sequence (longer rise time) it is possible to prevent a large spike from being capacitively coupled onto a control gate of the SST which might otherwise cause a program inhibit function to fail. As a result, the program inhibit function can be guaranteed to work properly for all word lines. Meanwhile, the total block program time is only increased a little compared to a device which uses the programming time $T_{PGM1}$ for all word lines.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the scope of the appended claims.

We claim:

1. A nonvolatile memory device, comprising:
   a nonvolatile memory cell array including a plurality of nonvolatile memory cells connected to a plurality of word lines; and
   a word line voltage generator configured to generate first and second sequences of voltage pulses, and to selectively supply one of the first and second sequences of voltage pulses to a selected one of the word lines to program the nonvolatile memory cells connected to the selected word line, wherein a slope of at least one voltage pulse of the first sequence of voltage pulses is greater than a slope of at least one voltage pulse of the second sequence of voltage pulses,
   wherein the word line voltage generator supplies the first sequence of voltage pulses when the selected word line belongs to a first set of one of more of the plurality of word lines, and wherein the word line voltage generator supplies the second sequence of voltage pulses when the selected word line belongs to a second set of one of more of the plurality of word lines.

2. The nonvolatile memory device of claim 1, wherein the nonvolatile memory cell array further comprises a plurality of bit lines and a plurality of select lines connected to each of the bit lines to select strings of the nonvolatile memory cells, wherein the second set of word lines is closer to one of the select lines than the first set of word lines is.

3. The nonvolatile memory device of claim 1, wherein at least one of the first and second sequences of voltage pulses comprises a series of increasing voltage pulses.

4. The nonvolatile memory device of claim 1, wherein the voltage pulses of the first sequence of voltage pulses all have a first slope, and the voltage pulses of the second sequence of voltage pulses all have a second slope less than the first slope.

5. The nonvolatile memory device of claim 1, wherein at least two of the voltage pulses of the second sequence of voltage pulses have the same slope as each other.

6. The nonvolatile memory device of claim 1, at least two of the voltage pulses of the second sequence of voltage pulses have different slopes from each other.

7. The nonvolatile memory device of claim 1, wherein all of the voltage pulses of the second sequence of voltage pulses have slopes that are less than slopes of all of the voltage pulses of the first sequence of voltage pulses.

8. The nonvolatile memory device of claim 1, wherein the word line voltage generator comprises:
   a step voltage generator adapted to generate the first sequence of voltage pulses; and
   a word line slope controller adapted to control the slope of at least one of the voltage pulses of the first sequence of voltage pulses to generate the second sequence of voltage pulses.

9. The nonvolatile memory device of claim 8, wherein the word line voltage generator further comprises a multiplexer to provide the first sequence of voltage pulses to the word line slope controller when the word line voltage generator selectively supplies the second sequence of voltage pulses, and to bypass the word line slope controller when the when the word line voltage generator selectively supplies the first sequence of voltage pulses.

10. The nonvolatile memory device of claim 8, wherein the word line voltage generator further comprises a multiplexer adapted to receive the first and second sequences of voltage pulses and to selectively output one of the first and second sequences of voltage pulses.

11. The nonvolatile memory device of claim 1, wherein the word line voltage generator includes:
   a voltage ladder providing a plurality of voltages; and
   a step voltage controller for selecting a voltage from the voltage ladder in each of a plurality of time periods.

12. The nonvolatile memory device of claim 11, wherein the step voltage controller selects the voltage from the voltage ladder in each of the plurality of time periods to control the slope of at least one of the voltage pulses in response to a row address corresponding to the selected word line.

13. The nonvolatile memory device of claim 1, wherein the word line slope controller includes:
   a voltage ladder providing a plurality of voltages;
   a time controller outputting a clock signal comprising a plurality of time periods; and
   a step voltage controller for selecting a voltage from the voltage ladder in each of a plurality of time periods;
   wherein the time controller sets the time periods to control the slope of at least one of the voltage pulses in response to a row address corresponding to the selected word line.

14. The nonvolatile memory device of claim 1, wherein the word line voltage generator is further configured to generate a third sequence of voltage pulses and to selectively supply one of the first, second, and third sequences of voltage pulses to the selected word line to program the nonvolatile memory cells connected to the selected word line, wherein a slope of at least one voltage pulse of the third sequence of voltage pulse is greater than the slope of the at least one voltage pulse of the first sequence of voltage pulses.

15. A nonvolatile memory device, comprising:
   a nonvolatile memory cell array including plurality of nonvolatile memory cells connected to a plurality of word lines and a plurality of bit lines, the memory cells of each bit line including a plurality of strings, the array further including a plurality of select lines for selecting the strings, and the word lines including at least a first set of one or more word lines and a second set of one or more word lines; and
   a word line voltage generator configured to generate first and second sequences of voltage pulses to program the nonvolatile memory cells connected to a selected one of the word lines, to supply the first sequence of voltage pulses to the selected word line when the selected word line belongs to the first set of one or more word lines, and to supply the second sequence of voltage pulses to the selected word line when the selected word line belongs to the second set of one or more word lines, wherein the second set of one or more word lines is closer to one of the select lines than the first set of one or more word lines is, and wherein a slope of at least one voltage pulse of the first sequence of voltage pulses is greater than a slope of at least one voltage pulse of the second sequence of voltage pulses.

16. The nonvolatile memory device of claim 15, wherein at least one of the first and second sequences of voltage pulses comprises a series of increasing voltage pulses.

17. The nonvolatile memory device of claim 15, wherein at least two of the voltage pulses of the second sequence of voltage pulses have the same slope as each other.

18. The nonvolatile memory device of claim 15, wherein at least two of the voltage pulses of the second sequence of voltage pulses have different slopes from each other.

19. The nonvolatile memory device of claim 15, wherein the word line voltage generator comprises:
   a step voltage generator adapted to generate the first sequence of voltage pulses; and
   a word line slope controller adapted to control the slope of at least one of the voltage pulses of the first sequence of voltage pulses to generate the second sequence of voltage pulses.

20. The nonvolatile memory device of claim 15, wherein the word line voltage generator is further configured to generate a third sequence of voltage pulses and to selectively supply one of the first, second, and third sequences of voltage pulses to the selected word line to program the nonvolatile memory cells connected to the selected word line, wherein a slope of at least one voltage pulse of the third sequence of voltage pulse is greater than the slope of the at least one voltage pulse of the first sequence of voltage pulses.

21. A method of programming a nonvolatile memory device comprising a nonvolatile memory cell array including a plurality of nonvolatile memory cells connected to a plurality of word lines, the method comprising:
   applying a first sequence of voltage pulses to a first one of the word lines when programming the nonvolatile memory cells connected to the first word line; and
   applying a second sequence of voltage pulses to a second one of the word lines when programming the nonvolatile memory cells connected to the second word line,
   wherein a slope of at least one voltage pulse of the first sequence of voltage pulses is greater than a slope of at least one voltage pulse of the second sequence of voltage pulses,
   wherein the nonvolatile memory cell array further comprises a plurality of bit lines and a plurality of select lines connected to each of the bit lines to select strings of the nonvolatile memory cells, wherein the second word line is closer to one of the select lines than the first word line is.

22. The method of claim 21, wherein at least one of the first and second sequences of voltage pulses comprises a series of increasing voltage pulses.

23. The method of claim 21, wherein the voltage pulses of the first sequence of voltage pulses all have a first slope, and the voltage pulses of the second sequence of voltage pulses all have a second slope less than the first slope.

24. The method of claim 21, wherein at least two of the voltage pulses of the second sequence of voltage pulses have the same slope as each other.

25. The method of claim 21, wherein at least two of the voltage pulses of the second sequence of voltage pulses have different slopes from each other.

26. The method of claim 21, further comprising applying the first sequence of voltage pulses to a third one of the word lines when programming the nonvolatile memory cells connected to the third word line.

27. The method of claim 21, further comprising applying a third sequence of voltage pulses to a third one of the word lines when programming the nonvolatile memory cells connected to the third word line, wherein a slope of at least one voltage pulse of the third sequence of voltage pulse is greater than the slope of the at least one voltage pulse of the first sequence of voltage pulses.

28. A system, comprising:
a nonvolatile memory device, comprising:
a nonvolatile memory cell array including a plurality of nonvolatile memory cells connected to a plurality of word lines; and
a word line voltage generator configured to generate first and second sequences of voltage pulses, and to selectively supply one of the first and second sequences of voltage pulses to a selected one of the word lines to program the nonvolatile memory cells connected to the selected word line, wherein a slope of at least one voltage pulse of the first sequence of voltage pulses is greater than a slope of at least one voltage pulse of the second sequence of voltage pulses; and
a memory controller for supplying an address corresponding to the selected word line for writing data to one or more of the nonvolatile memory cells connected to the selected word line,
wherein the word line voltage generator supplies the first sequence of voltage pulses when the selected word line belongs to a first set of one of more of the plurality of word lines, and wherein the word line voltage generator supplies the second sequence of voltage pulses when the selected word line belongs to a second set of one of more of the plurality of word lines.

29. The system of claim 28, wherein the nonvolatile memory cell array further comprises a plurality of bit lines and a plurality of select lines connected to each of the bit lines adapted to select strings of the nonvolatile memory cells, wherein the second set of word lines is closer to one of the select lines than the first set of word lines is.

30. The system of claim 28, wherein at least one of the first and second sequences of voltage pulses comprises a series of increasing voltage pulses.

31. The system of claim 28, wherein the voltage pulses of the first sequence of voltage pulses all have a first slope, and the voltage pulses of the second sequence of voltage pulses all have a second slope less than the first slope.

32. The system of claim 28, wherein at least two of the voltage pulses of the second sequence of voltage pulses have the same slope as each other.

33. The system of claim 28, wherein at least two of the voltage pulses of the second sequence of voltage pulses have different slopes from each other.

34. The system of claim 28, wherein the word line voltage generator comprises:
a step voltage generator adapted to generate the first sequence of voltage pulses; and
a word line slope controller adapted to control the slope of at least one of the voltage pulses of the first sequence of voltage pulses to generate the second sequence of voltage pulses.

35. The system of claim 34, wherein the word line voltage generator further comprises a multiplexer to provide the first sequence of voltage pulses to the word line slope controller when the word line voltage generator selectively supplies the second sequence of voltage pulses, and to bypass the word line slope controller when the when the word line voltage generator selectively supplies the first sequence of voltage pulses.

36. The system of claim 34, wherein the word line voltage generator further comprises a multiplexer adapted to receive the first and second sequences of voltage pulses and to selectively output one of the first and second sequences of voltage pulses.

37. The system of claim 34, wherein the word line slope controller includes:
a voltage ladder providing a plurality of voltages; and
a step voltage controller for selecting a voltage from the voltage ladder in each of a plurality of time periods.

38. The system of claim 37, wherein the step voltage controller selects the voltage from the voltage ladder in each of the plurality of time periods to control the slope of at least one of the voltage pulses in response to the address supplied by the memory controller.

39. The system of claim 34, wherein the word line slope controller includes:
a voltage ladder providing a plurality of voltages;
a time controller outputting a clock signal comprising a plurality of time periods; and
a step voltage controller for selecting a voltage from the voltage ladder in each of a plurality of time periods;
wherein the time controller sets the time periods to control the slopes of at least one of the voltage pulses in response to the address supplied by the memory controller.

* * * * *